US009026347B2

(12) United States Patent
Gadh et al.

(10) Patent No.: US 9,026,347 B2
(45) Date of Patent: May 5, 2015

(54) SMART ELECTRIC VEHICLE (EV) CHARGING AND GRID INTEGRATION APPARATUS AND METHODS

(71) Applicant: The Regents of The University of California, Oakland, CA (US)

(72) Inventors: Rajit Gadh, Los Angeles, CA (US); Siddhartha Mal, Santa Monica, CA (US); Shivanand Prabhu, Los Angeles, CA (US); Chi-Cheng Chu, Laguna Beach, CA (US); Omar Sheikh, Valencia, CA (US); Ching-Yen Chung, New Taipei (TW); Lei He, Irvine, CA (US); Bingjun Xiao, Los Angeles, CA (US); Yiyu Shi, Rolla, MO (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/693,747

(22) Filed: Dec. 4, 2012

(65) Prior Publication Data
US 2013/0179061 A1 Jul. 11, 2013

Related U.S. Application Data

(63) Continuation of application No. PCT/US2011/040077, filed on Jun. 10, 2011.

(60) Provisional application No. 61/353,627, filed on Jun. 10, 2010, provisional application No. 61/353,685, filed on Jun. 11, 2010, provisional application No. 61/354,116, filed on Jun. 11, 2010, provisional application No. 61/478,357, filed on Apr. 22, 2011.

(51) Int. Cl.
*H02J 3/14* (2006.01)
*B60L 11/18* (2006.01)
*G01R 31/36* (2006.01)

(52) U.S. Cl.
CPC ......... *B60L 11/1824* (2013.01); *B60L 11/1842* (2013.01); *B60L 11/1844* (2013.01);

(Continued)

(58) Field of Classification Search
USPC ................ 701/22, 123; 700/297; 705/1.1, 39; 307/48; 320/109, 132, 136; 370/254; 180/242, 272; 361/62; 380/277
See application file for complete search history.

(56) References Cited

U.S. PATENT DOCUMENTS 5,295,078 A * 3/1994 Stich et al. ..................... 700/297
2006/0022643 A1 * 2/2006 Brost et al. ..................... 320/132

(Continued)

FOREIGN PATENT DOCUMENTS

WO 2008073476 A2 6/2008

OTHER PUBLICATIONS

Korean Intellectual Property Office, International Search Report and Written Opinion issued on Feb. 17, 2012 for corresponding International Patent Application No. PCT/US2011/040077 (pp. 1-9) with claims searched (pp. 10-16) pp. 1-16.

*Primary Examiner* — Tuan C. To
*Assistant Examiner* — Yuri Kan
(74) *Attorney, Agent, or Firm* — John P. O'Banion

(57) ABSTRACT

An expert system manages a power grid wherein charging stations are connected to the power grid, with electric vehicles connected to the charging stations, whereby the expert system selectively backfills power from connected electric vehicles to the power grid through a grid tie inverter (if present) within the charging stations. In more traditional usage, the expert system allows for electric vehicle charging, coupled with user preferences as to charge time, charge cost, and charging station capabilities, without exceeding the power grid capacity at any point. A robust yet accurate state of charge (SOC) calculation method is also presented, whereby initially an open circuit voltage (OCV) based on sampled battery voltages and currents is calculated, and then the SOC is obtained based on a mapping between a previously measured reference OCV (ROCV) and SOC. The OCV-SOC calculation method accommodates likely any battery type with any current profile.

20 Claims, 24 Drawing Sheets

(52) U.S. Cl.
CPC ............... *B60L2230/22* (2013.01); *H02J 3/14* (2013.01); *H02J 2003/146* (2013.01); *G01R 31/3624* (2013.01); *Y02B 70/3225* (2013.01); *Y02T 10/7088* (2013.01); *Y02T 10/7005* (2013.01); *Y02T 90/163* (2013.01); *Y02T 90/168* (2013.01); *Y02T 10/7011* (2013.01); *Y02T 90/14* (2013.01); *Y02T 90/128* (2013.01); *Y04S 10/126* (2013.01); *Y04S 20/222* (2013.01); *Y04S 20/224* (2013.01); *Y04S 30/12* (2013.01); *Y02E 60/721* (2013.01)

(56) References Cited

U.S. PATENT DOCUMENTS

| | | | |
|---|---|---|---|
| 2006/0072262 A1* | 4/2006 | Paik et al. | 361/62 |
| 2006/0261782 A1* | 11/2006 | Kim et al. | 320/132 |
| 2007/0024242 A1* | 2/2007 | Seo et al. | 320/132 |
| 2007/0193808 A1* | 8/2007 | Perakes et al. | 180/242 |
| 2008/0048621 A1* | 2/2008 | Yun | 320/136 |
| 2009/0222143 A1 | 9/2009 | Kempton | |
| 2009/0229900 A1 | 9/2009 | Hafner et al. | |
| 2009/0259603 A1 | 10/2009 | Housh et al. | |
| 2009/0313033 A1* | 12/2009 | Hafner et al. | 705/1 |
| 2010/0271974 A1* | 10/2010 | Byard | 370/254 |
| 2010/0294583 A1* | 11/2010 | Biondo et al. | 180/272 |
| 2011/0200193 A1* | 8/2011 | Blitz et al. | 380/277 |
| 2011/0251744 A1* | 10/2011 | Amano et al. | 701/22 |
| 2011/0298422 A1* | 12/2011 | Failing | 320/109 |
| 2011/0302078 A1* | 12/2011 | Failing | 705/39 |
| 2012/0200160 A1* | 8/2012 | Pratt et al. | 307/48 |

* cited by examiner

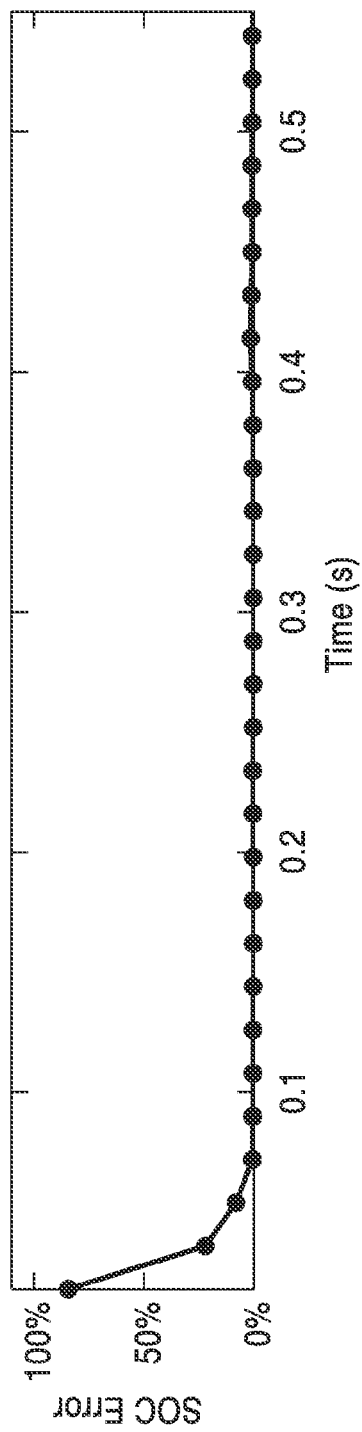
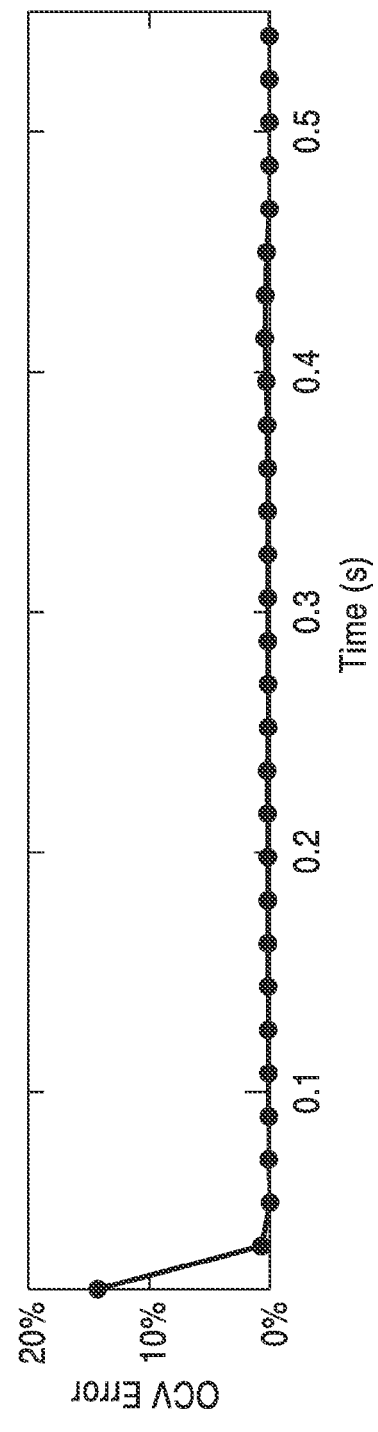
FIG. 18A
FIG. 18B

SMART ELECTRIC VEHICLE (EV) CHARGING AND GRID INTEGRATION APPARATUS AND METHODS

CROSS-REFERENCE TO RELATED APPLICATIONS

This application is a 35 U.S.C. §111(a) continuation of PCT international application number PCT/US2011/040077 filed on Jun. 10, 2011, which is a nonprovisional of U.S. provisional patent application Ser. No. 61/353,627 filed on Jun. 10, 2010, a nonprovisional of U.S. provisional patent application Ser. No. 61/353,685 filed on Jun. 11, 2010, a nonprovisional of U.S. provisional patent application Ser. No. 61/354,116 filed on Jun. 11, 2010, and a nonprovisional of U.S. provisional patent application Ser. No. 61/478,357 filed on Apr. 22, 2011, each of which is incorporated herein by reference in its entirety. Each of the foregoing applications is incorporated herein by reference in its entirety. Priority is claimed to each of the foregoing applications.

The above-referenced PCT international application was published as PCT International Publication No. WO 2011/15676 on Dec. 15, 2011 and republished on Apr. 5, 2012, and is incorporated herein by reference in its entirety.

STATEMENT REGARDING FEDERALLY SPONSORED RESEARCH OR DEVELOPMENT

This invention was made with Government support under DE-OE0000192, awarded by the U.S. Department of Energy. The Government has certain rights in the invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to electric vehicles (EVs), and more particularly to infrastructure modifications and additions to provide capabilities for charging many EVs over a power supply grid.

2. Description of Related Art

Recent advances in battery technology and communications, information, and wireless technologies, as well as increased awareness in green energy and greenhouse gases, have resulted in dramatic innovations in electric vehicles using these technologies. Products such as the Nissan Leaf, Chevy Volt, and Ford Focus Electric are being promoted in the process of creating mass markets for electric vehicles in the United States. Electric utilities, on their part, are working towards enhancing their own infrastructures through both their own investments as well as those from the United States Department of Energy (US DOE) Stimulus Grants. These infrastructure enhancements will require massive changes in distribution as well as transmission systems.

If 25% of all vehicles were electric vehicles (EVs), the present infrastructure in the United States would be unable to support charging those EVs. Some electric utilities have reported numbers that indicate that even a single 220V charger within the circuit served by a transformer may, during peak consumption hours, overload and burn out the transformer. Therefore, the existing infrastructure needs to be upgraded both from a capacity standpoint as well as from a flexibility and power routing and control standpoint.

Adding capacity to an electric utility's infrastructure is far more expensive than adding intelligence and a smart power routing capability, and the eventual solution will likely require a smart combination of both. Certainly, adding auxiliary power sources at the edge of the power network such as residential solar photovoltaic cells (PVCs) to feed into the grid would help from a capacity standpoint, but using such alternative power sources in a smart manner so as to move the energy around to where it is needed from where it is produced will require a very smart grid.

BRIEF SUMMARY OF THE INVENTION

While adding capacity and adding smartness are challenges, there are unique opportunities that electric vehicles (EVs) can provide. Due to the large number of batteries contained in these EVs, there is a potential of aggregating them to create an energy storage buffer that can absorb excessive power during low-load periods such as during the night, and become an additional source of electrical power during high-load periods, such as a hot summer's afternoon. Such a system could help substantially with demand response, which is a key and yet challenging problem for the utilities. This EV source of energy can also provide buffer power for smoothing out frequency fluctuations resulting from mismatched demand (generation versus consumption), and may therefore be used for demand dispatch by the utilities.

All of these needs and capabilities require the integration of sophisticated technologies that include, without limitation, communications, wireless, sense-and-control, Internet, mobile, cloud computing, lithium-ion and other battery technologies, superconductors, etc. The technical approach shown here aggregates the state of the charge information from vehicles with demand dispatch and demand response signals to automatically achieve grid-to-vehicle charging or reverse charging from vehicle-to-grid.

Accordingly, an aspect of the present invention is to create a "smart" electric vehicle that includes a computer and software that runs on the computer. The software may include, for example, programming for performing various functions for the operation of vehicle charging system. Examples include calculating open circuit voltage (OCV) and corresponding state of charge (SOC) of the vehicle's battery. The electric vehicle may also include a voltage sensor connected to the computer and associated programming for measuring battery voltage, and as well as a current sensor connected to the computer and programming for measuring battery current. Additionally, the electric vehicle may include a global positioning sensor for determining the position of the electric vehicle, a transmitter for transmitting the position, state of charge, and identification of the electric vehicle. The electric vehicle may include a receiver for receiving information from a remote source. Such information received from the remote source may include the location of a charging station, the charge capacity of the charging station, and the cost per kWh of charge at the charging station.

According to another aspect of the invention, a charging station may be provided for charging an electric vehicle. The charging station may, for example, also provide for receipt of by an electric vehicle, the location of the charging station, the charge capacity of the charging station, and the cost per kWh of charge at the charging station. The cost per kWh of charge at the charging station may be static or dynamic. The charging station may include a grid tie inverter connected to a power grid whereby power from a connected electric vehicle is backfilled to the power grid. The charging station may include a transceiver for communicating with an electric vehicle, control system, etc.

Another aspect of the invention is to provide a client portal. The client portal may include, for example, a display device and a transceiver. The transceiver may, for example, provide for wirelessly communicating with an electric vehicle, a charging station, and/or a power grid expert system. The display device may, for example, indicate state of charge of the electric vehicle, a projected range of the electric vehicle, and cost per kWh of charge at a charging station.

Still another aspect of the invention is to provide a power grid expert system. The power grid expert system may include, for example, a computer and software with programming for managing a power grid, one or more charging stations connected to the power grid, and zero or more electric vehicles connected to each charging station. The grid expert system may, for example, selectively backfill power from electric vehicles to the power grid through a grid tie inverter within one or more of the charging stations if at least one electric vehicle is connected to one charging station.

Another aspect of the invention is to provide means for aperiodically charging the electric vehicle's battery from a power grid, such as from a charging station. The charging station may include a grid tie inverter connected to the power grid, whereby the electric vehicle battery is selectively discharged to provide power to the power grid.

In still another aspect of the invention, a method of calculating a state of charge of a battery is provided. The method may include, for example, mapping a reference open circuit voltage (ROCV) to a Reference state of charge (RSOC) of the battery through a discharge cycle to produce a ROCV-RSOC mapping, measuring a current and a voltage over a period of time from the battery, calculating an open circuit voltage (OCV) of the battery under a load, and determining the state of charge (SOC) by using the ROCV-RSOC mapping. This method of calculating state of charge of a battery may include, for example, determining a maximum capacity of the battery and tracking over time the maximum capacity of the battery as a state of health of the battery. In this method of calculating state of charge of a battery, the calculating step does not use a schematic model of the battery.

The method of calculating state of charge of a battery may include, for example, determining a time-averaged current draw by averaging the current over the period of time from the battery, determining a time-averaged electric vehicle speed by averaging an electric vehicle speed over another period of time, determining a remaining battery capacity by multiplying the state of charge (SOC) by a maximum capacity of the battery, and determining a remaining range by dividing the remaining battery capacity by the time-averaged current draw, and multiplying by the time-averaged electric vehicle speed. The method may further include, for example, transmitting from the electric vehicle the remaining range to a client portal. Here, the transmitting step may be either direct or via a relayed transmission.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 18A is a graph of state of charge (SOC) error after several ~20 ms extraction steps according to the teachings herein.

FIG. 18B is a graph of open circuit voltage (OCV) error after several ~20 ms extraction steps according to the teachings herein.

DETAILED DESCRIPTION OF THE INVENTION

A. WINSmartEV

Figure 1:
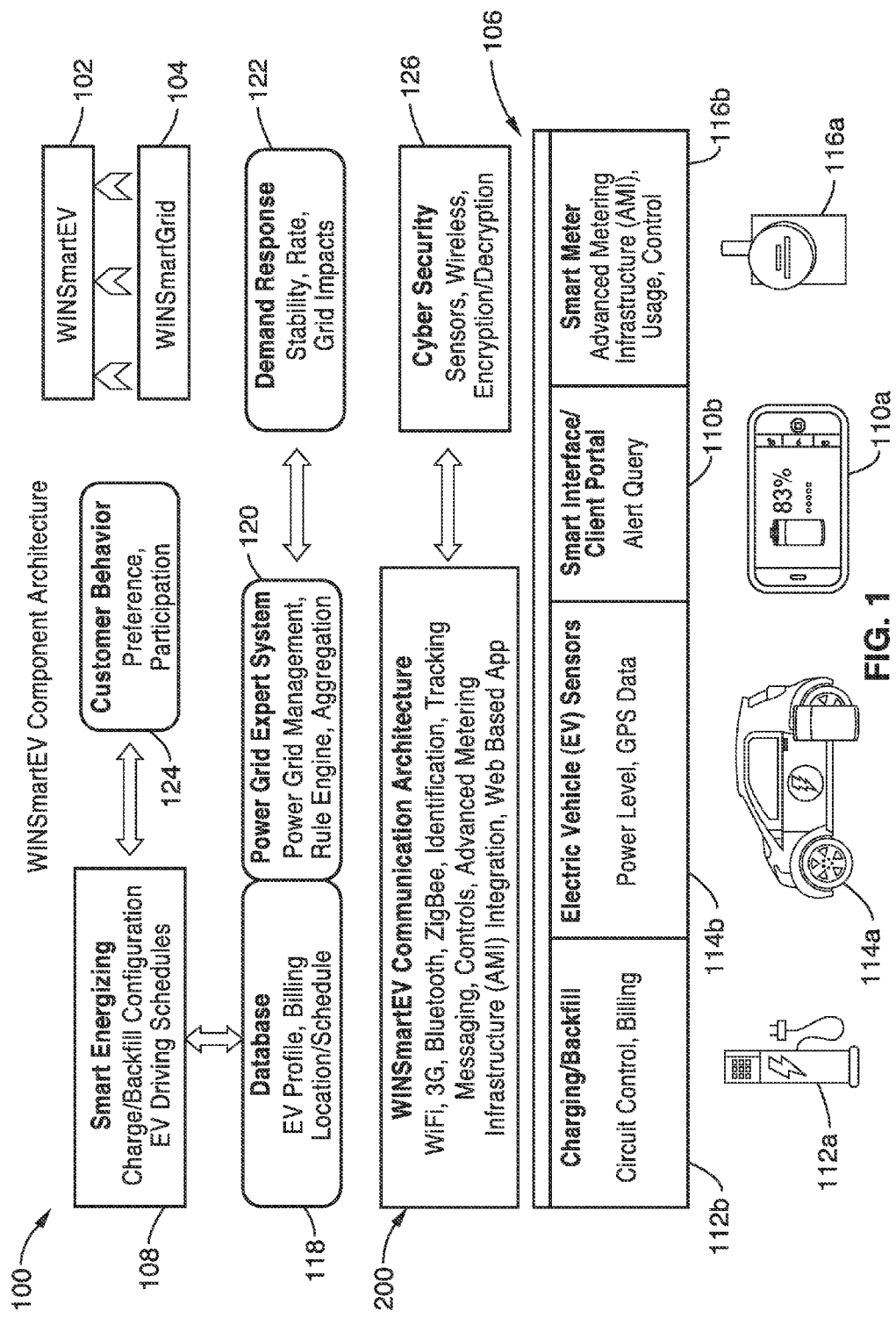
FIG. 1 is a block diagram of the various components of an embodiment of the WINSmartEV architecture according to the present invention.

WINSmartEV, as the term is used herein, is a system for smart charging electric vehicles (EVs) and optionally using batteries in the EVs for backfilling to a power grid via charging stations equipped with grid tie inverters. FIG. 1 shows a block diagram of the various components of an embodiment of the WINSmartEV architecture 100 according to the present invention. Here, WINSmartEV 102 synergistically interacts with a WINSmartGrid 104. Major components of WINSmartEV may include: a platform 106, a smart energizing module 108, a client portal 110a (with a suitable display and control application executable 110b on it), and radio frequency identification (RFID) and radio frequency (RF) sensor technology embedded in charging or backfilling stations 112a (with hardware circuit control and billing software 112b) and electric vehicles 114a (with battery current and voltage sensors, a battery management system, and global positioning system 114b). In some implementations, RFID and RF sensor technology may be associated with smart meters 116a (using an advanced metering infrastructure AMI for usage monitoring and control 116b) as well.

1. Platform

The platform 106 is used as the infrastructure to: 1) connect to EV 114a electric power sensors, global positioning system (GPS) chips, and other EV data; 2) control and utilize the wireless network for communication; 3) allow data filtration, aggregation and messaging; and 4) provide a portal 110 for data integration and decision making.

2. Smart Energizing

Smart Energizing 108 is the management of EV 114 battery charging rates and extent of the charge backfill station 112 based on some or all data, including, but not limited to: grid stability, energy cost, vehicle location, battery status, driver preferences, and driving patterns.

The Smart Energizing 108 module would communicate with database 118 containing information including, but not limited to: EV profiles, billing locations and schedules, and customer behavior data.

3. Smart Interface—Client Portal

Users may set charging requirements for their vehicles, e.g. maximum time, maximum price, using a web or smart phone application, referred to herein as either a smart interface or client portal 110. These charging requirements become a user's "charging profile."

Real-time information about available charging stations, type of charger capacities, ability to both charge and backfill (grid tying), type of battery in the current EV, and dynamic pricing from the utility will affect the maximum and minimum limits for user selectable parameters of charge time and price.

User profile information may include the different vehicles the user operates, a charging profile for each vehicle, and optionally for each day of the week, a user immutable charge priority (e.g. emergency response vehicle), as well as a confidence level associated with how accurately the user adheres to his charging profile. For instance, does the user actually leave earlier than the time specified by their maximum charging time? (This would imply that a faster charging with commensurate higher costs might be an option.)

4. Aggregator or Expert System

A power grid expert system 120 (perhaps elsewhere referred to as an "aggregator") is provided to address grid balancing, grid management and prediction of peak and off-peak hours to store excess capacity, and/or demands for large numbers of EVs charging efficiently, economically and safely.

For example, user charging profiles (e.g. time and price requirements) and utility time-of-day charging restrictions and maximum load limits are used to dynamically schedule charging for one to "n" number of EVs.

The aggregator preferably directly communicates with and controls charging or backfilling stations 112, either by a proportional function of charge current control or simple on/off toggling at specific charge rates.

The aggregator also preferably provides a portal for utilities to chronologically view and control "big picture" charging status for a large number of vehicles, predict load demand, and plan demand response 122. Demand response 122 would concentrate on stability, rates, and grid impacts for various load and backfill situations.

The aggregator may also create daily, weekly, or monthly projections for energy demand based on user profile data.

By means of the power grid expert system 120, utilities could set peak hours during which charging should be avoided and, contingent on availability, the storage capacities of specified EVs could be used to augment power generation during periods of high demand in a modified demand response scenario.

5. RFID and RF Sensor Technology

RFID or RF-sensor tags on the EVs and charging stations may be used to track and identify usage and preference information of each EV. Automatic charge/discharge intelligence may also be stored within some managed smart RFID tags.

EV usage information and electric grid status may be collected wirelessly to determine better efficient and economic charging operation of the EVs. This information may be used to form the basis of "customer intelligence" whereby the activities and preferences of a user are stored and analyzed in a "Customer Behavior" 124 module. Due to different grid stability/reliability, geographical location of the EVs and driving patterns of the EVs, effective management of charging and backfill operations are used to lower electricity rates and flatten electric load curve. Each EV is equipped with a handheld device to allow the driver to receive instructions or seek advice to better manage the EVs' battery charging/backfill process.

The WINSmartEV component architecture includes a WINSmartEV communication architecture 200, which will be further described below. It is understood that in today's world, cyber security 126 must be used to protect the various communication linkages with encryption and decryption of wireless and wired messages to and from various sensors.

For example, an alert (such as to a smart phone acting as a client portal 110a) may be issued to the driver when the battery capacity falls below a threshold level. The alert could include a list of near-by charging station locations, distances, charge rate current capacities, whether they have grid tie inverters, and projected energy costs based on the time of the day. The client portal application 110b may additionally use a system to inform the driver of the optimum course of action.

The batteries on the EVs when not in driving status can also be collectively used to serve as the energy storage which then backfills into the local electric grid to prevent power outage during peak demand. In this scenario, an alert may be issued to a driver's smart interface 110 when a predicted instability in the grid is detected. The alert can instruct the driver to bring the vehicle to the appropriate charging station to serve as a backfill battery.

Existing EVs and charging stations usage patterns may be used to determine the appropriate sensors and wireless communication modules to be installed. Communication and alerting systems are implemented by integrating the system within the Advanced Metering Infrastructure (AMI) and the Demand Response system.

Pricing models are also integrated into the preferences, aggregation and usage models by the consumer.

6. Platform Features

It will be appreciated, therefore, that features of platform 106 include the following:

(a) a smart aggregation method allows the power grid expert system 120 or utility to create monitoring and controls for EVs 114a, which would be a generalizable and scalable approach;

(b) a simplified user client portal 110a allows for rapid setting of various preferences by a consumer or user;

(c) a generic method to connect the various EVs 114a into an aggregated platform is provided;

(d) a direct linkage between the user and their EV 114a is provided;

(e) the platform assists the electric utility with managing energy consumption in a microgrid fashion;

(f) the platform allows the electric utility to achieve demand response through simple instructions via the aggregation system;

(g) the platform connects the electric utility to the customer via the aggregation system; and (h) hot swappable connectivity for testing various electric vehicle and communication technologies for implementation of Vehicle-to-Grid and Grid-to-Vehicle power flow is provided.

7. Communication

Inherent in all of the WINSmartEV interconnections are communications associated with cyber security 126 methods to reduce system susceptibilities.

Figure 2A:
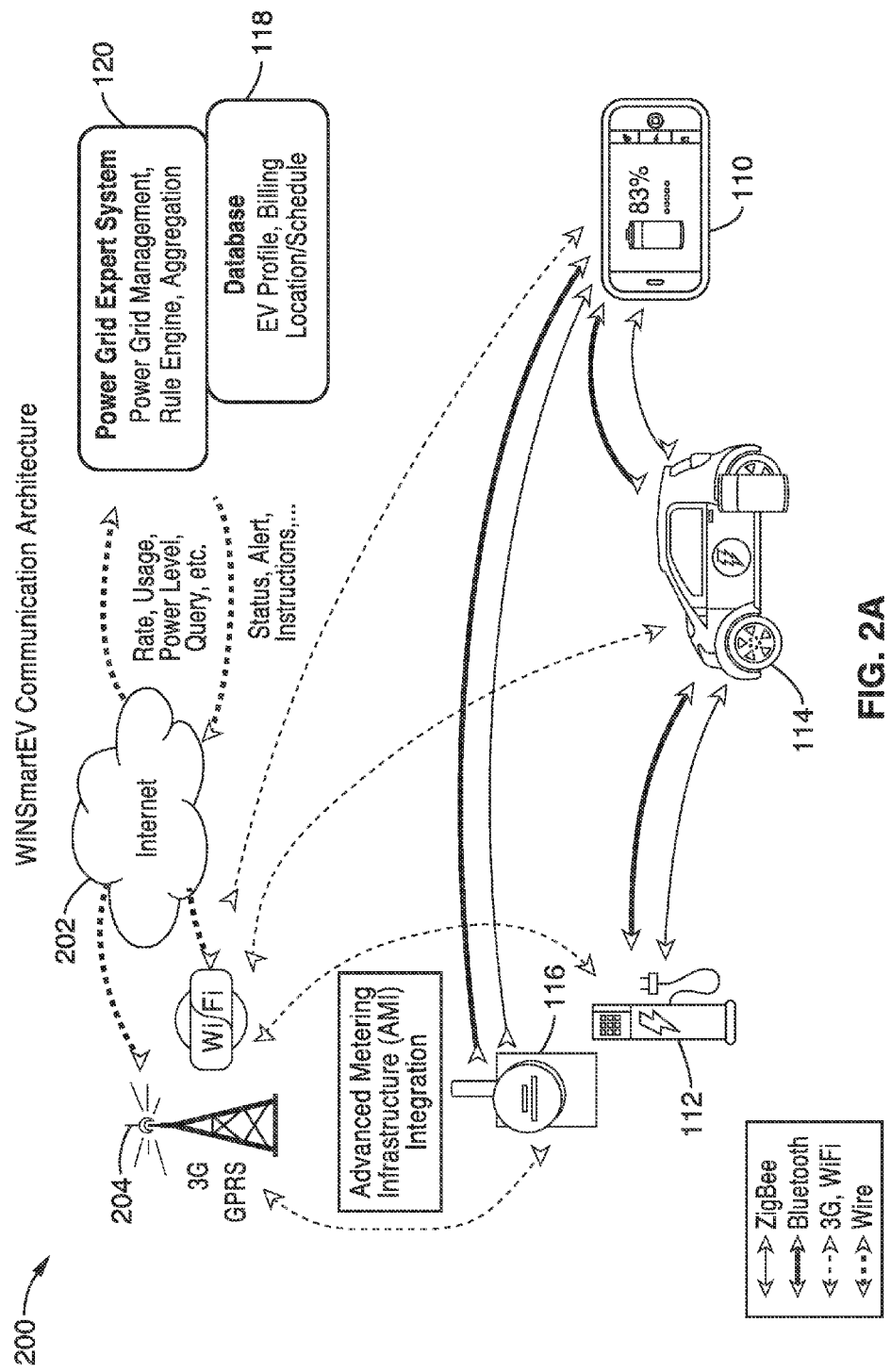
FIG. 2A is a block diagram of the various components of the WINSmartEV communication architecture according to the present invention.

Refer now to FIG. 2, which is a block diagram 200 of the various components of an embodiment of the WINSmartEV communication architecture according to the present invention. The power grid expert system (PGES) 120 uses the database 118 previously discussed to communicate through the internet 202 to a 3G or GPRS cell or WiFi tower 204. Up to this point, all communications may be wired (fiber optically connected). The previously described smart meters 116, EVs 114, charging or backfilling stations 112, and client portals 110 may communicate either directly through ZigBee or Bluetooth protocols, or indirectly through a 3G or GPRS cell or WiFi tower 204. Various other methods are used in the overall communication architecture, including, but not limited to: WiFi, 3G, Bluetooth, ZigBee, RFID, global positioning system (GPS) tracking, messaging, controls, advanced metering infrastructure (AMI) integration, and web based control and monitoring applications.

Figure 2B:
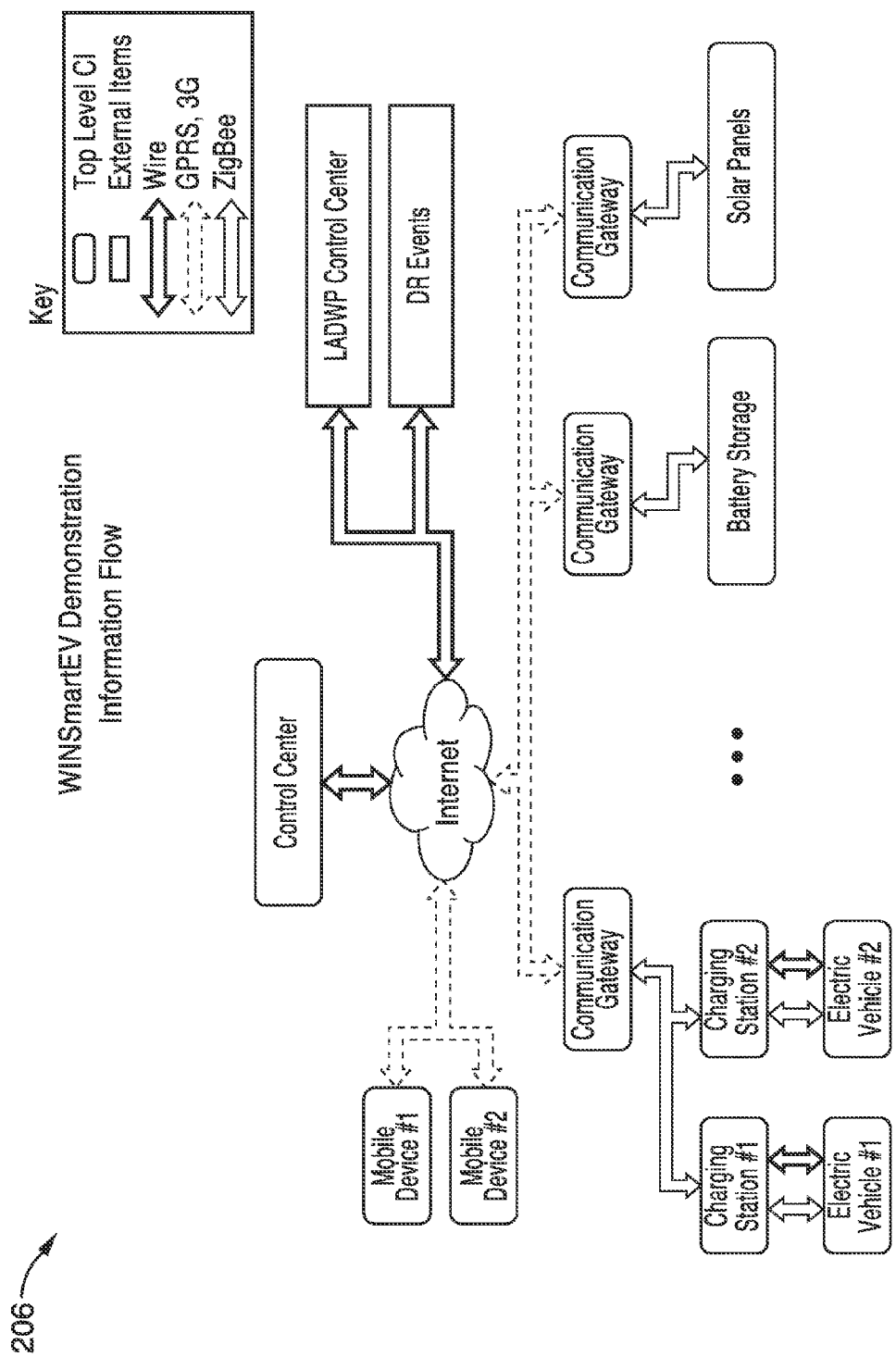
FIG. 2B is a block diagram of the various components of the UCLA WINSmartEV communication architecture demonstrating the information paths between components according to an embodiment of the present invention.

FIG. 2B is a block diagram of the various components of an embodiment of a WINSmartEV communication architecture according to the present invention, demonstrating the information paths between components. This will be discussed further in Section C. "Recent Developments" below.

8. Operation of WINSmartEV

Figure 3:
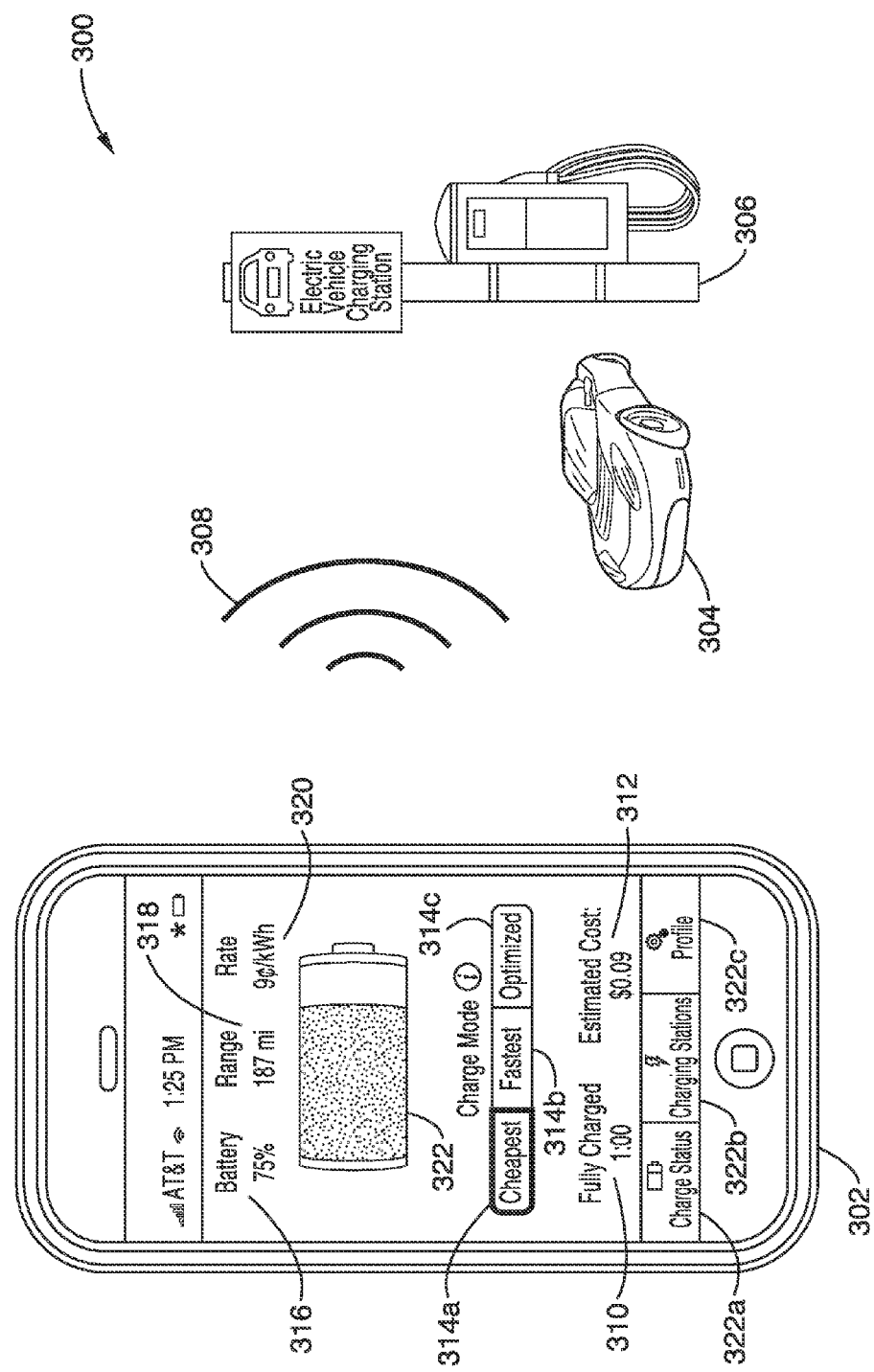
FIG. 3 is a diagram showing how a smart phone may be used in conjunction with an electric vehicle charging station to provide cost of charging information for cheapest, fastest, and optimized charging, taking into account the cost of electricity at the location of the charging station, according to an embodiment of the invention.

Refer now to FIG. 3, which is a diagram 300 showing how a smart phone 302 may be as a client portal (see FIG. 1, 110a) used in conjunction with an electric vehicle 304 charging station 306 to provide cost of charging information for cheapest, fastest, and optimized charging, taking into account the cost of electricity at the location of the charging station 306. Using the communications previously described in FIG. 2, the smart phone 302 may communicate 308 with either or both of the electric vehicle 304 and the charging station 306. Such communications 308 may be used to determine what the estimated charge time 310 and a real-time cost 312 for a selected charge mode 314. Here, the "Cheapest" charge mode 314a is set among other modes that include "Fastest" 314b and "Optimized" 314c, which are elucidated below.

In this scenario, the electric vehicle 304 may provide the battery state of charge 316 in percent. By knowing the capacity of the battery and the state of charge 316, and the estimated rate of discharge for the particular electric vehicle 304, an estimated range 318 may be calculated. By transferring data from the nearest charging station 306, the smart phone 302 may also display the expected charging cost per kWh 320.

Additionally, the battery state of charge 316 may be displayed 320 as a traditionally discharging battery bar graph.

The user selectable charge mode 314 may be selected from three modes: cheapest, fastest, and optimized. During a "cheapest" 314a charge, the electric vehicle 304 is charged in the cheapest possible manner given the cost per kWh at the charging station 306 and the charge receiving characteristics of the electric vehicle 304. Similarly, during the "fastest" 314b charge, the electric vehicle is charged at its maximum rate, regardless of cost per kWh. Finally, during an "optimized" 314c charge, the charging may be optimized based on both system defined limits (charge acceptance capacity of the electric vehicle 304, charging limits and costs of the charging station 306, and user assigned values relating their time availability and cost of their time.)

Figure 4:
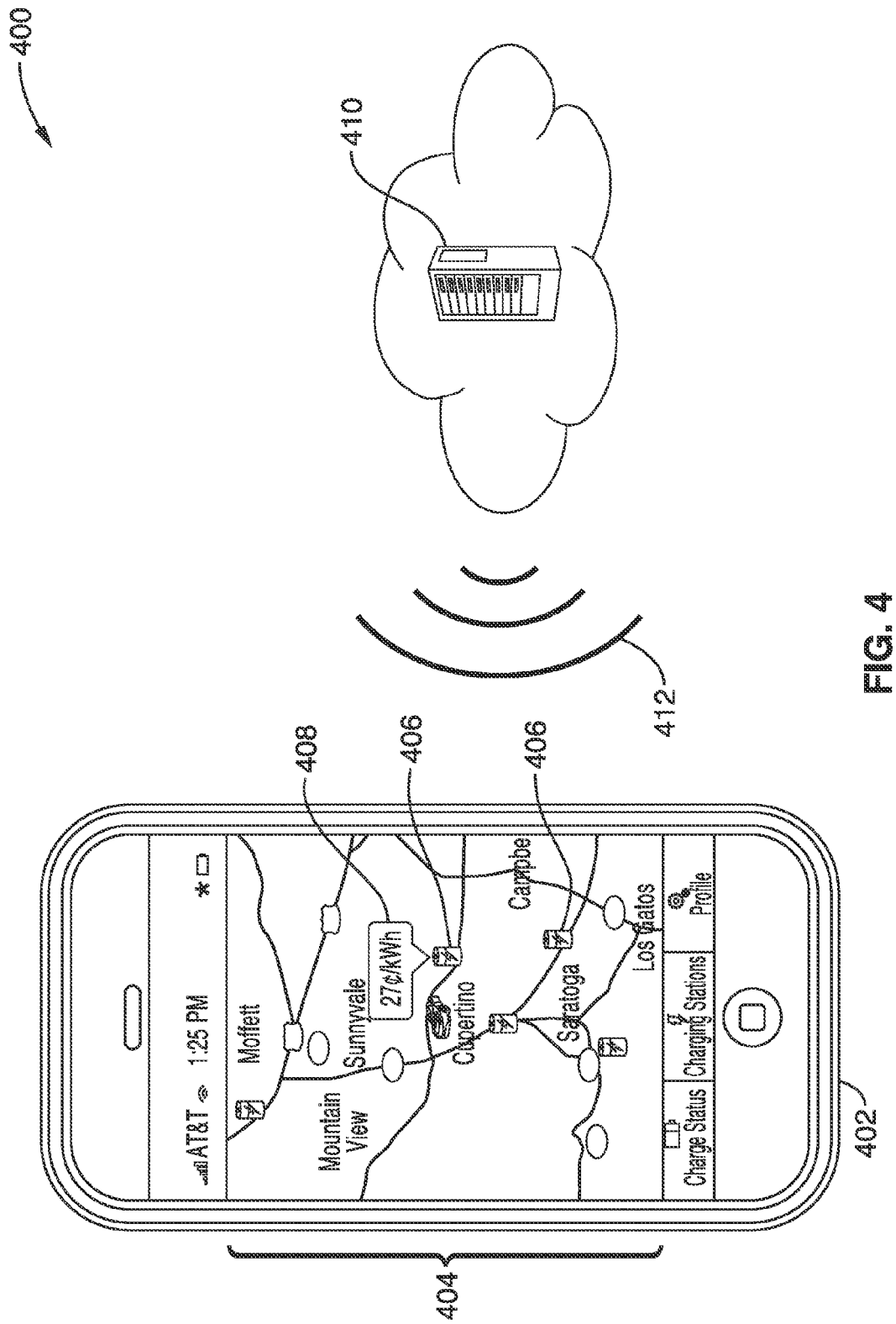
FIG. 4 is a diagram showing a smart phone displaying a map of nearby charging stations, and a nearby charging station pushing real-time charging information to the smart phone, according to an embodiment of the invention.

Refer now to FIG. 4, which is a diagram 400 showing a smart phone 402 displaying a map 404 of nearby charging stations 406, and a nearby charging station pushing real-time charging information to the smart phone 402 resulting in a cost per kWh 408.

Since the smart phone 402 may be outside the direct reception range of a nearby charging station 406, a server 410 may push 412 the information on a real time basis based on the location of the EV monitored by the smart phone 402, and the cost of charging at that location. Such a data connection would require information regarding the location of the smart phone 402, likely from cell tower connection location, or global positioning system (GPS) hardware on the smart phone 402.

Figure 5:
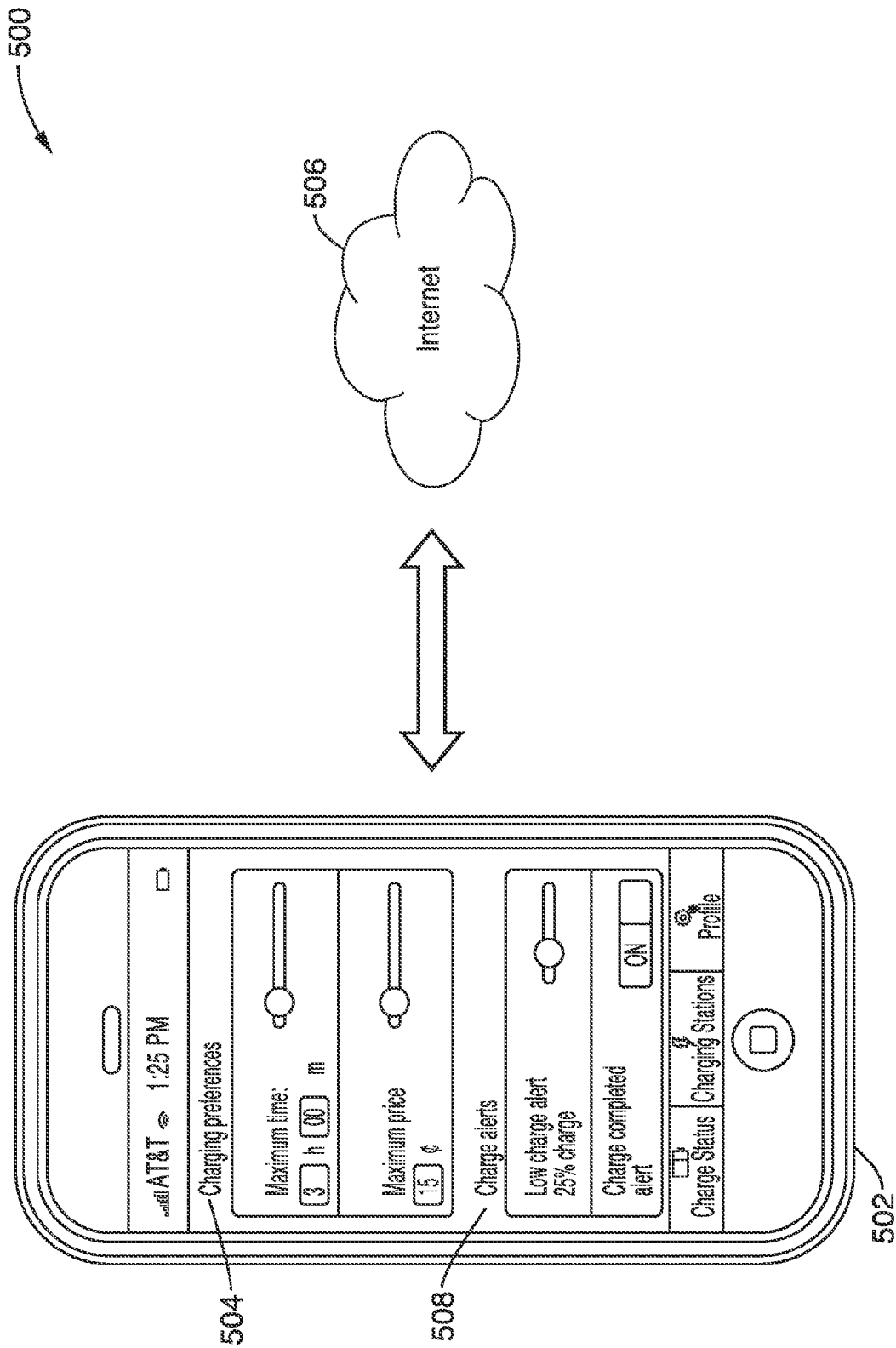
FIG. 5 is a diagram of a smart phone displaying user charging preferences, and how such preferences may be stored on an Internet cloud, according to an embodiment of the invention.

Refer now to FIG. 5, which is a diagram 500 of a smart phone 502 displaying user charging preferences 504, and how such user preferences may be stored on an internet cloud 506, allowing for access from nearly anywhere, with a variety of devices. Among such preferences may be maxima and minima for: total cost allowed for charging, charging time allowed, and desired EV travel range. Various alerts 508 may also be set for charge completion or low charge states.

Figure 6:
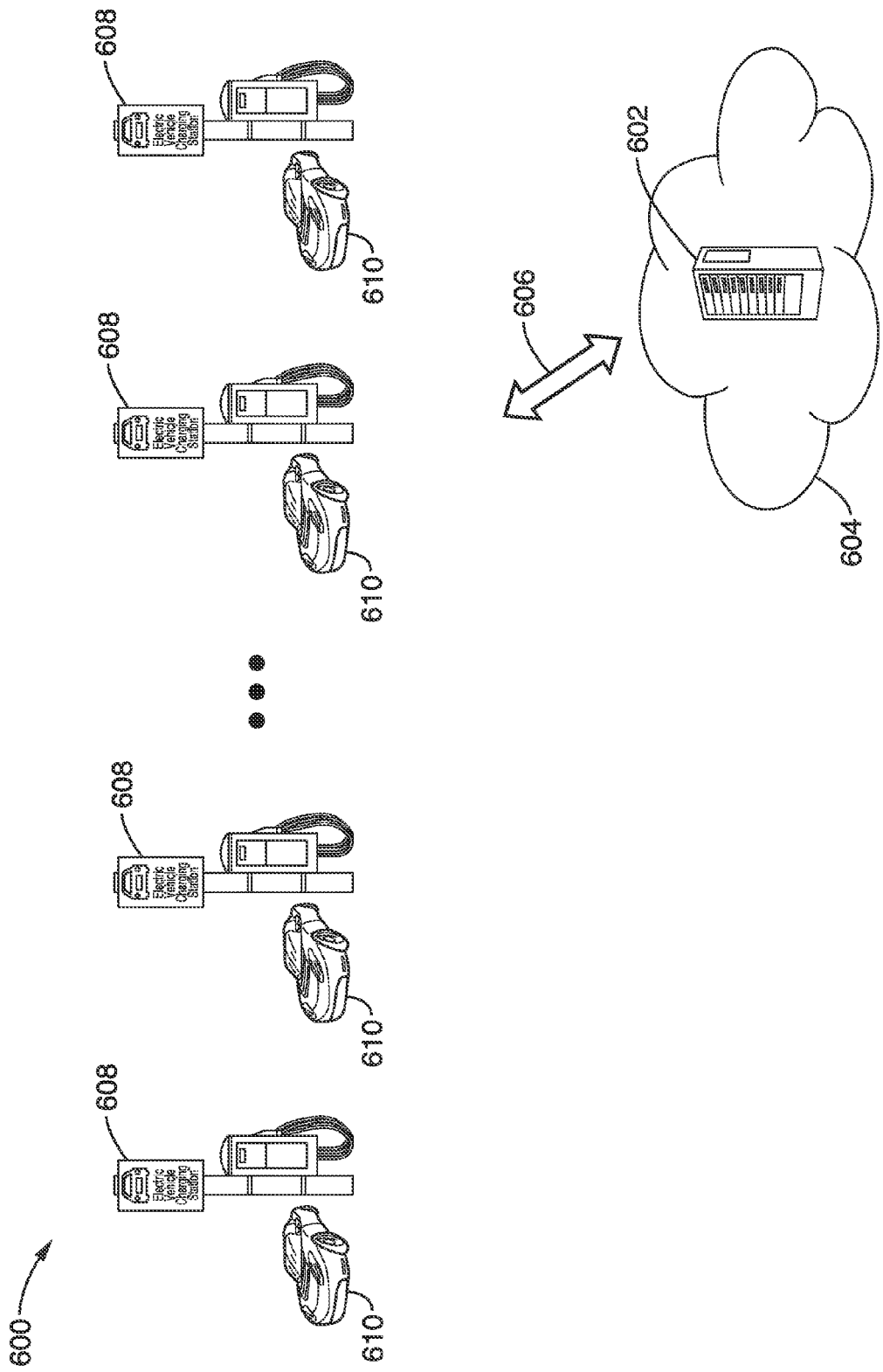
FIG. 6 is a diagram of a central server, typically based on an Internet cloud, in communication with multiple charging stations, whereby the central server may intelligently coordinate the charging of many electric vehicles based on user charging preferences, according to an embodiment of the invention.

Refer now to FIG. 6, which is a diagram 600 of a central server 602, typically based on an internet cloud 604, in communication 606 with multiple charging stations 608, whereby the central server may intelligently coordinate the charging of many electric vehicles 610 based on user charging preferences stored in a database on the central server 602. Here, the central server 602 may control simultaneous charging of many vehicles, based on users' profiles, selections of charge modes, allowable charging costs, and allowable time limits for charging.

9. WINSmartEV Test Bed: EV Smart Charging or Discharging for Grid Integration

Figure 7:
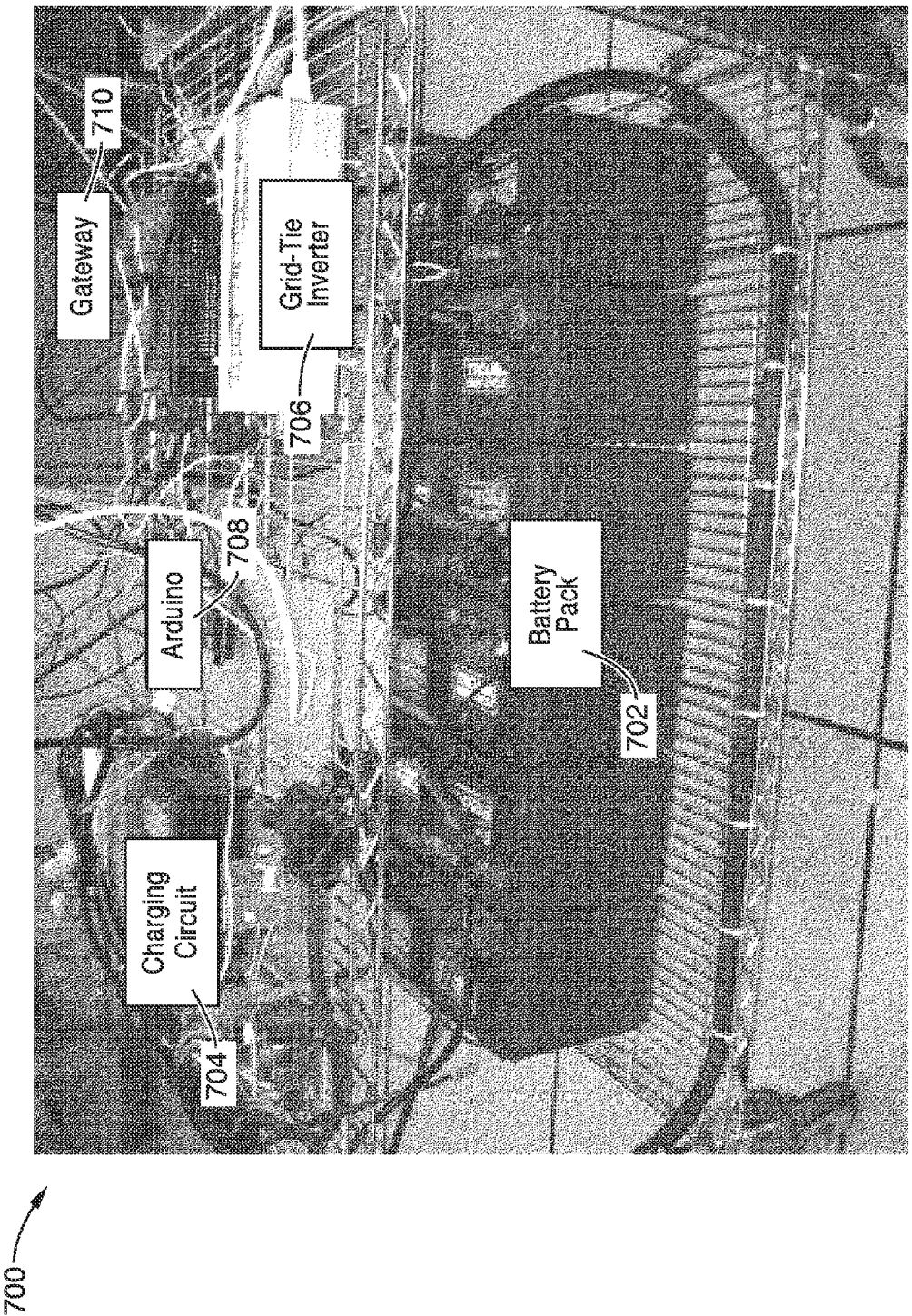
FIG. 7 is a photograph of a WINSmartEV test bed for a low powered electric vehicle setup according to an embodiment of the invention.

Refer now to FIG. 7, which is a photograph of a WINSmartEV test bed 700 for a low powered electric vehicle setup. The WINSmartEV test bed allows for the analysis of electric vehicle battery management in order to provide smart scheduling for consumer charging of electric vehicles and smart discharging for vehicle-to-grid implementation. The test bed allows for the implementation of control signals sent from an electric vehicle aggregation operator through various communication channels. The testing of these communication channels is important since there are several communications restrictions in parking garage scenarios where the electric vehicles will be located. Also, the communications must support sense-and-control requirements of the test bed. The WINSmartEV test bed allows for different load conditions to be tested with varying bidirectional power flow and multiple communications technologies to analyze various scenarios of electric vehicle charging, discharging, and grid backfilling.

Current state of the art Vehicle-to-Grid implementations involve proprietary software and hardware architectures that do not allow for testing of the various electric vehicle charging/discharging environments.

FIG. 7 shows an exemplary test bed setup with the components of a Low Powered Electric Vehicle (LPEV). The hardware comprises the LPEV lead acid batteries 702 connected to the charging and battery management system 704. The batteries 702 are charged from the grid by connecting the charging system to the grid power through a grid tie inverter 706. For the bi-directional flow, 4 of the 6 batteries 702 shown in FIG. 7 are connected to a grid tie inverter 706 that monitors the grid power waveform for phase alignment, and then converts the battery 702 DC power to AC power. The AC output of the grid tie inverter 706 is synchronized in phase to the grid power to prevent harmful harmonics.

Connected to the charging and battery management system 704 and the grid tie inverter 706 is an Arduino microcontroller 708 and contactors for high power switching. The Arduino microcontroller 708 receives input from the gateway 710 and actuates the contactors as well as takes measurements of the batteries 702.

The gateway 710 is an x86_64 computer running Debian Linux. It acts as a web server, database server, ssh server, and manages all Arduino microcontrollers connected to the gateway 710 via Universal Serial Bus or xBee ZigBee communication chip. The gateway also has a touch screen connected, which shows a menu for controlling charging, discharging, activation of individual appliances, HVAC, etc.

The gateway 710 also wirelessly communicates to the Control Center/Electric Vehicle Aggregation Operator (Aggregator). The aggregator will take in user schedules via mobile application as well as other factors that affect charging in order to implement higher level control algorithms to optimize charging/discharging. The Aggregator may in fact also be the power grid expert system. The higher level control algorithms for optimization control algorithms may be dynamic and simulated virtually prior to application. Simulation and testing are done through MATLAB® and Simulink® software as well as other resources to determine appropriate use.

Six analog inputs are used from the Arduino microcontroller 708 to measure the battery 702 health. Information on the each of the batteries voltages is determined using resistance voltage dividers. This allows for close monitoring of battery pack cells to determine faulty cells which lead to the overall degradation of the pack. Battery 702 current is measured by Hall Effect sensors. The Hall Effect sensors use a secondary Arduino microcontroller for measurement. With both current and voltage total power consumption and generation of the battery 702 system can be accurately monitored.

A relay board is used to actuate the charge and discharge systems. The test bed uses the Tern, (Tern, Inc., 1950 5th St. Davis, Calif. 95616, USA) Relay7 board. Solid state relays and contactors are used for the high-current application. The Relay7 board receives a signal from the Arduino microcontroller 708 to actuate the high power contactor or solid state relays. The Relay7 is connected to a separate Arduino microcontroller, which controls all of the Relay7's functions using pins 12-7 for activating the relays, and powers the ULN2003AN chip from the Arduino's 5V pin. The Relay7 requires a separate 12V power to activate the relays, which powered off either a 12V regulator, or a separate battery.

The Arduino microcontroller connected to the Relay7 board is also connected to a ZigBee microchip, which wirelessly receives a signal to activate either charging or discharging of the batteries 702.

ZigBee is one of most common low power and low data rate protocols based on IEEE 802.15.4 in wireless communications. For the mesh network, there are 65535 devices addressable in the 16 bit network address. Besides the basic ZigBee protocol, ZigBee Alliance also has several specifications about Smart Grid: ZigBee Smart Energy, ZigBee Remote Control, ZigBee Building Automation, and ZigBee Home Automation. Among these specifications, the ZigBee Smart Energy Profile attracts more attention than others because it has been identified as a standard for implementation in the National Institute of Standards and Technology (NIST)'s Framework and Roadmap for Smart Grid Interoperability Standards.

Figure 8:
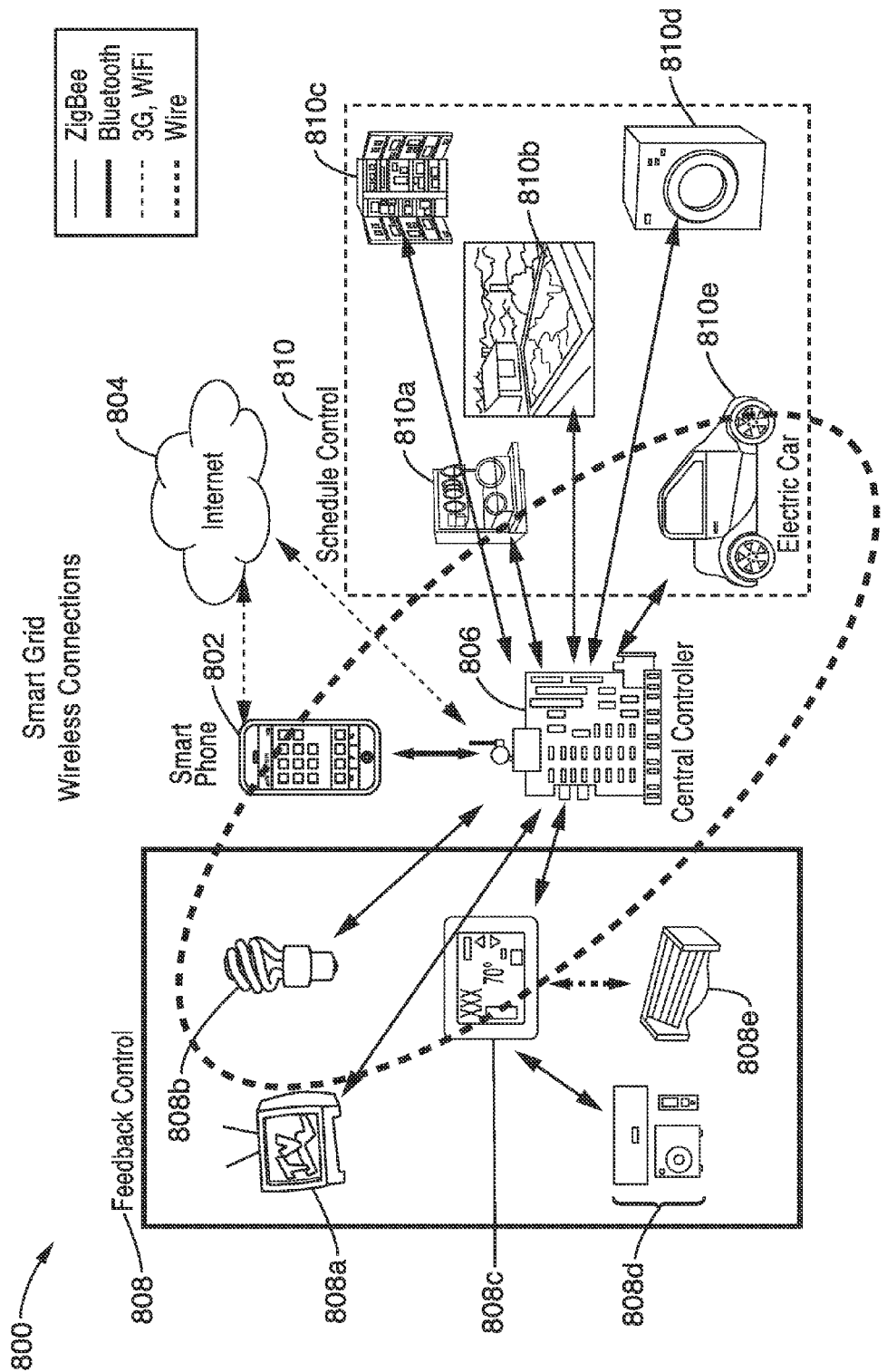
FIG. 8 is a diagram of wired or wireless communication interconnections among a set of sense and control modules for an implementation of a Smart Grid home automation system.

Refer now to FIG. 8, which is a diagram 800 of wired or wireless communication interconnections among a set of sense and control modules for an implementation of Smart Grid. Here, either a smart phone 802 or server on the internet 804 provides commands to a central controller 806. The central controller 806 in turn controls various groups of devices under feedback control 808 or schedule control 810. Under feedback control 808 are devices such as: a television 808a, a light 808b, a thermostat 808c, an air conditioner 808d, and a heater 808e. Under schedule control 810 may be appliances such as: a dishwasher 810a, a swimming pool (heater and/or filter) 810b, a refrigerator 810c, a washing machine 810d, and an electric car 810e (otherwise known as an electric vehicle).

The Smart Energy Profile 2.0 is an IP-based application layer protocol that is built on top of an Internet protocol stack. It defines the mechanisms for exchanging application messages, the exact messages exchanged including error messages, and the security features used to protect the application messages. It also defines the function sets for the Demand Response/Load Control and Electric Vehicle applications. The Demand Response/Load Control function set provides the interface for the client devices and server devices. In addition, the Plug-In Electric Vehicles data services provide the interfaces to exchange information such as PEV list, Battery list, Charge Transaction, Electric Vehicle information. There are four basic http methods including GET, PUT, POST, and DELETE in the specification. In short, Smart Energy Profile is the interface between web command and ZigBee mesh network and lies in the application layer in the firmware of ZigBee device.

ZigBee applied on the electrical vehicle test bed 700 provides an alternative communication way between the central server and electrical vehicles. Moreover, due to the characteristic of wireless mesh network, ZigBee reduces the infrastructure cost of the parking lot with charging stations. The following description shows how ZigBee mesh network works in the test bed.

Figure 9:
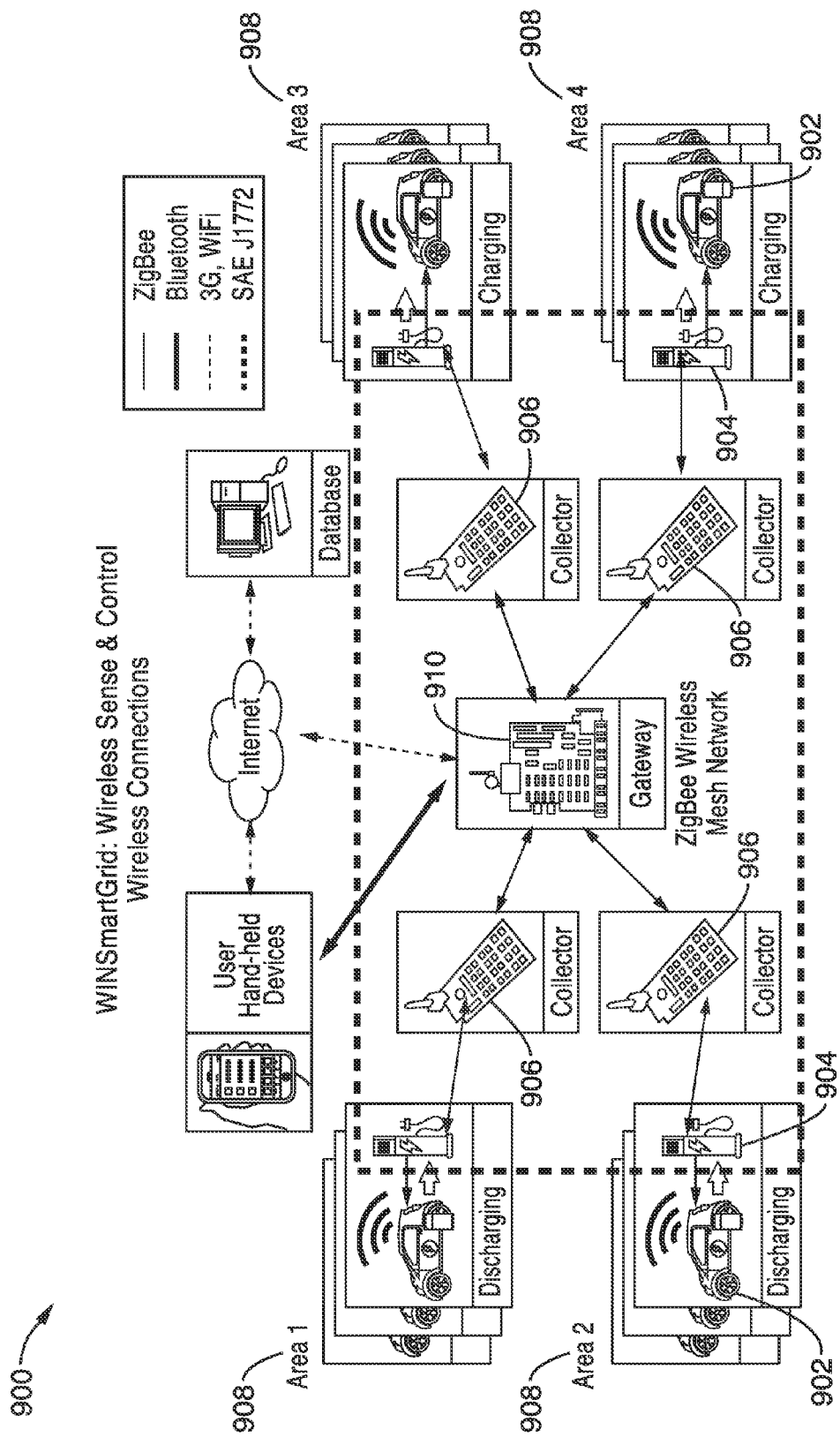
FIG. 9 is a diagram of a wireless communication schematic gateway among a set of WINSmartGrid wireless sense and control modules according to an embodiment of the invention.

Refer now to FIG. 9, which is a diagram 900 of a wireless communication schematic gateway among a set of WINSmartGrid wireless sense and control modules.

When the electric vehicle 902 connects to the charging station 904, no matter if the EV is charging or discharging, the information of battery status of the electric vehicle will be passed to the charging station by the standard charging cable interface SAE J1772 to collectors 906. The collectors 906 search and join an available mesh network automatically after startup and play the role of controllers to decide the charging/discharging process for the charging stations. Most of the time, the collector 906 is in the sleep status to save power. The collector 906 in each area 908 collects the data such as the charging status, voltage and temperature of the battery from the charging stations and then passes them to the gateway. After receiving the data, the gateway 910 passes the data to the central controller periodically. On the other hand, the gateway 910 also dispatches the command from the central controller to the charging station 904. The central controller decides the charging capacity of each area by the information provided by the energy provider and the status of each charging area. The wireless connections between central controller, gateway 910, and user hand-held devices are 3G or WiFi. The user hand-held devices can also access the gateway via Bluetooth with authorization. The main characteristic of the local gateway is the cooperation of different wireless protocols. The interference between different wireless protocols using the same bandwidth is also one of the central issues. Before applying the solutions to the interference problem, the dynamic model of the interference between different protocols and channels is established to describe the severance of interference.

The two-way communication between the collectors 906 and the gateway 910 forms the feedback control loop. The signal fed in the control block diagram is the user profile and the real-time price. The demand response signal plays the role of interrupt in the collectors. The decision making mechanism implemented in the collectors adopt a Fuzzy algorithm due to the limited computing resource. The issues about electric vehicle 902 charging/discharging management include the database management method, decision making method, cooperation of different protocols, Graphical User Interface (GUI) design, and firmware architecture design.

10. Smart Grid Demand-Response Automation Platform Environment

Figure 10:
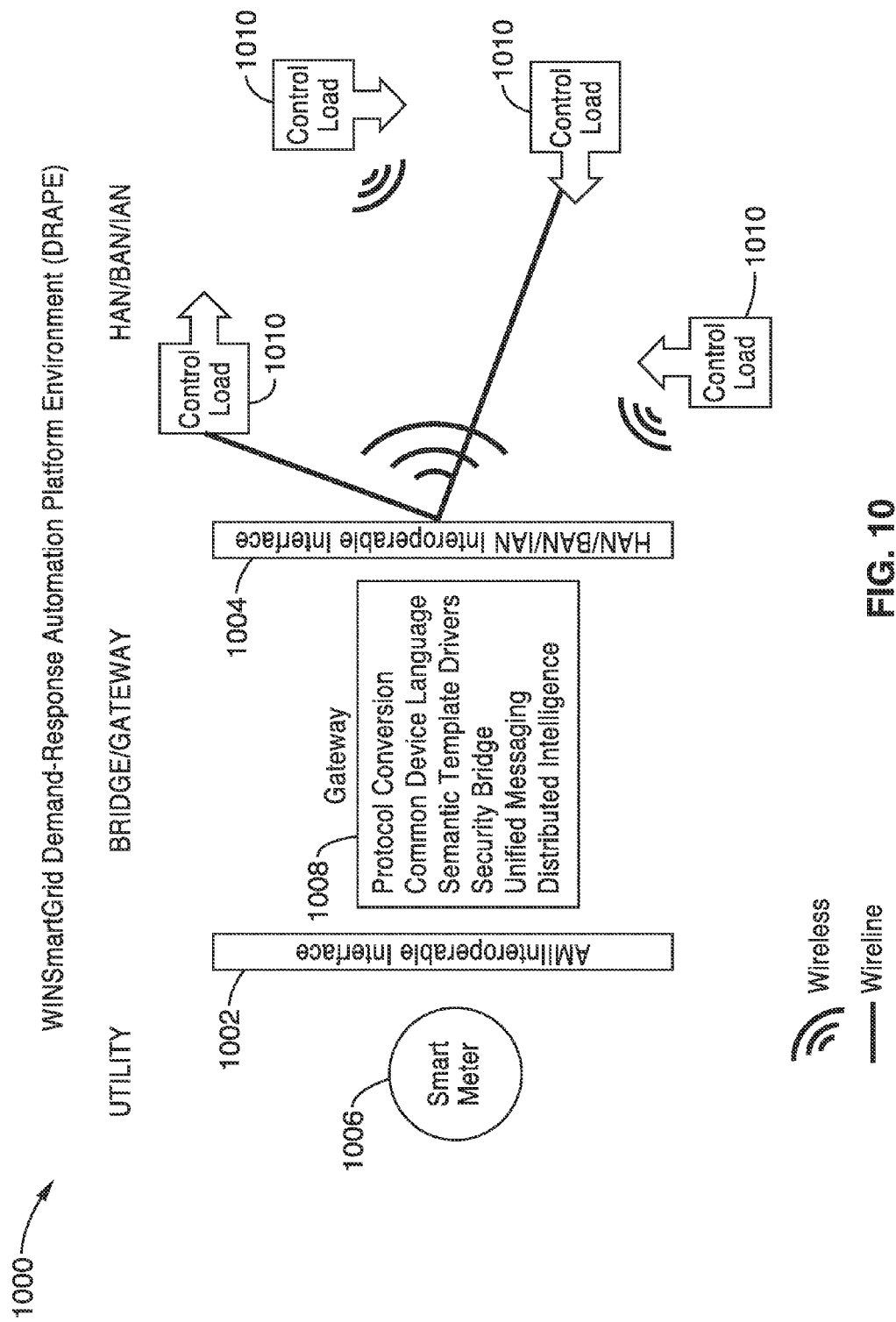
FIG. 10 is a diagram of communication interconnections among a set of WINSmartGrid wireless sense and control modules in the demand response automation platform environment (DRAPE) according to an embodiment of the invention.

Refer now to FIG. 10, which is a diagram 1000 of communication interconnections among a set of WINSmartGrid wireless sense and control modules in the demand response automation platform environment (DRAPE) according to an embodiment of the invention.

DRAPE would provide a sophisticated distributed management and control environment for utilities to exercise power-related demand response programs. DRAPE would provide two-way communication between the utility and the controlled environment such as homes, commercial buildings, industrial units, hospitals, and other types of utility consumers. DRAPE would accomplish this by providing an agnostic framework for different networks, protocols, communication links, data formats, and messaging schemes. The architecture of the platform is comprised of distributed intelligent embedded systems.

The invention would address key problems such as interoperability, and lack of failsafe operation that beset the automation domain due to the availability of large number of network technologies supporting large number of protocols, lack of robust interfaces between physical, network, and data layers, and adoption of proprietary messaging schemes.

With the roll-out plans of Smart Grid world-over, DRAPE would provide a standardized management and control solution for intelligent power delivery by utilities. The platform can be extended to water and gas delivery systems too.

Adaptive Intelligence in DRAPE embedded systems provides an agnostic framework for different networks, protocols, communication links, data formats, and messaging schemes. The intelligence on the platform node can be modified or upgraded remotely on need basis so that the necessary network end point or edge intelligence can maintain relevancy with respect to the network or device state.

DRAPE would be a valuable technology component of the smart grid. It will bridge two important smart grid technology layers—the Advanced Metering Infrastructure (AMI) interoperable interface 1002 and the Home Automation Network (HAN)/Building Automation Network (BAN)/Industry Automation Network (IAN) 1004. As a bridge it would provide 2-way seamless connectivity for data, messages, notifications/alerts irrespective of the communication, network, data formats and messaging schemes of AMI and xANs.

For example, a smart meter 1006 could communicate with the Advanced Metering Infrastructure (AMI) 1002 to pass load information to a gateway 1008. The gateway 1008 would in turn take care of various issues, including but not limited to: protocol conversion, common device languages, semantic template drivers, security bridging, unified messaging, and distributed intelligence.

Similarly, the gateway 1008 could provide access and control to controlled loads 1010 through the Home Automation Network (HAN)/Building Automation Network (BAN)/Industry Automation Network (IAN) 1004.

11. WINSmartGrid Implementation Challenges

Figure 11:
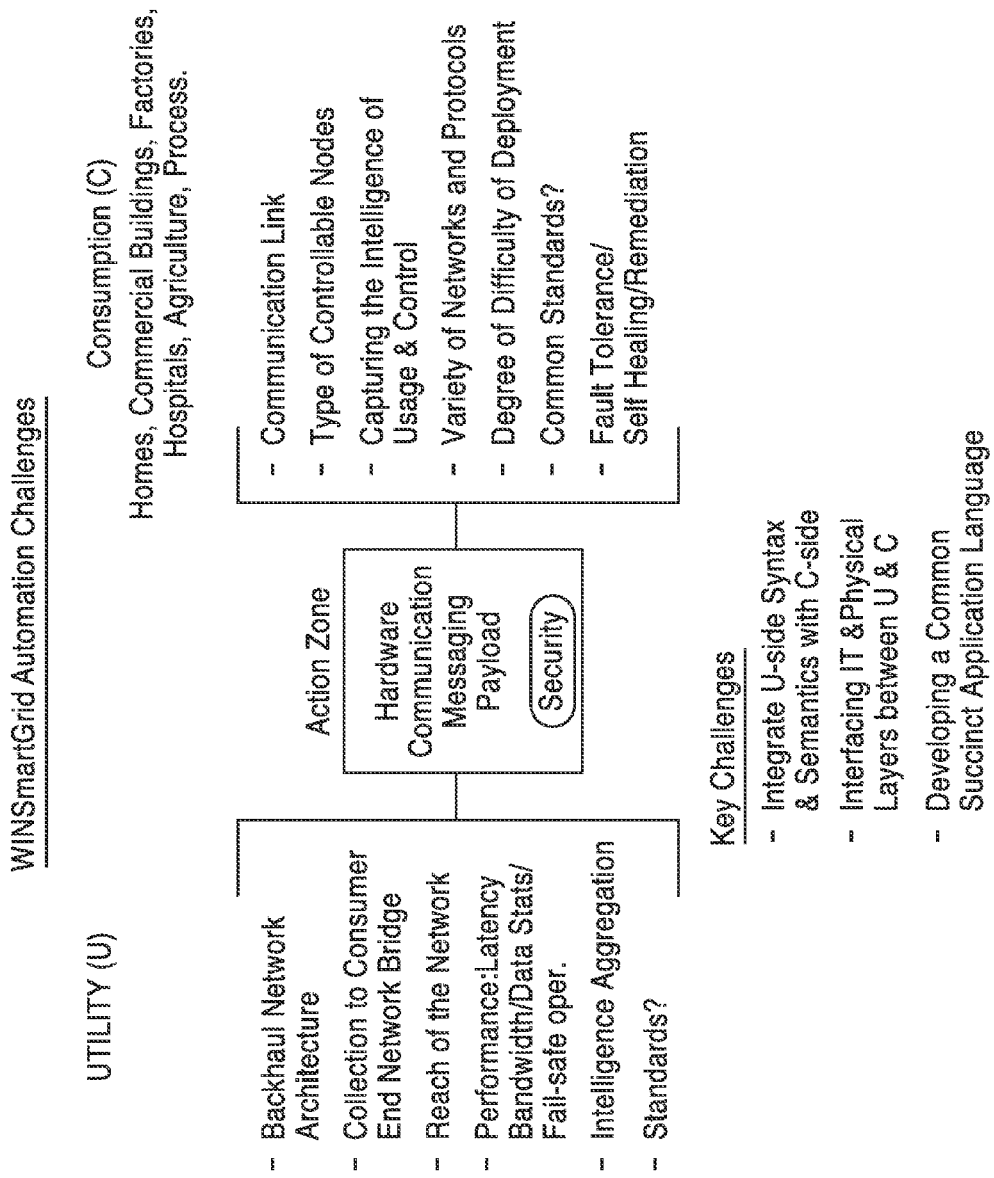
FIG. 11 is a diagram illustrating WINSmartGrid automation challenges.

Refer now to FIG. 11, which is a diagram of some of the WINSmartGrid automation challenges. This shows that some of the key challenges are: 1) the integration of the utility (U) side syntax with the commercial (C) side; interfacing information technology and physical layers between the U and C sides; and developing a common succinct application language.

Figure 12:
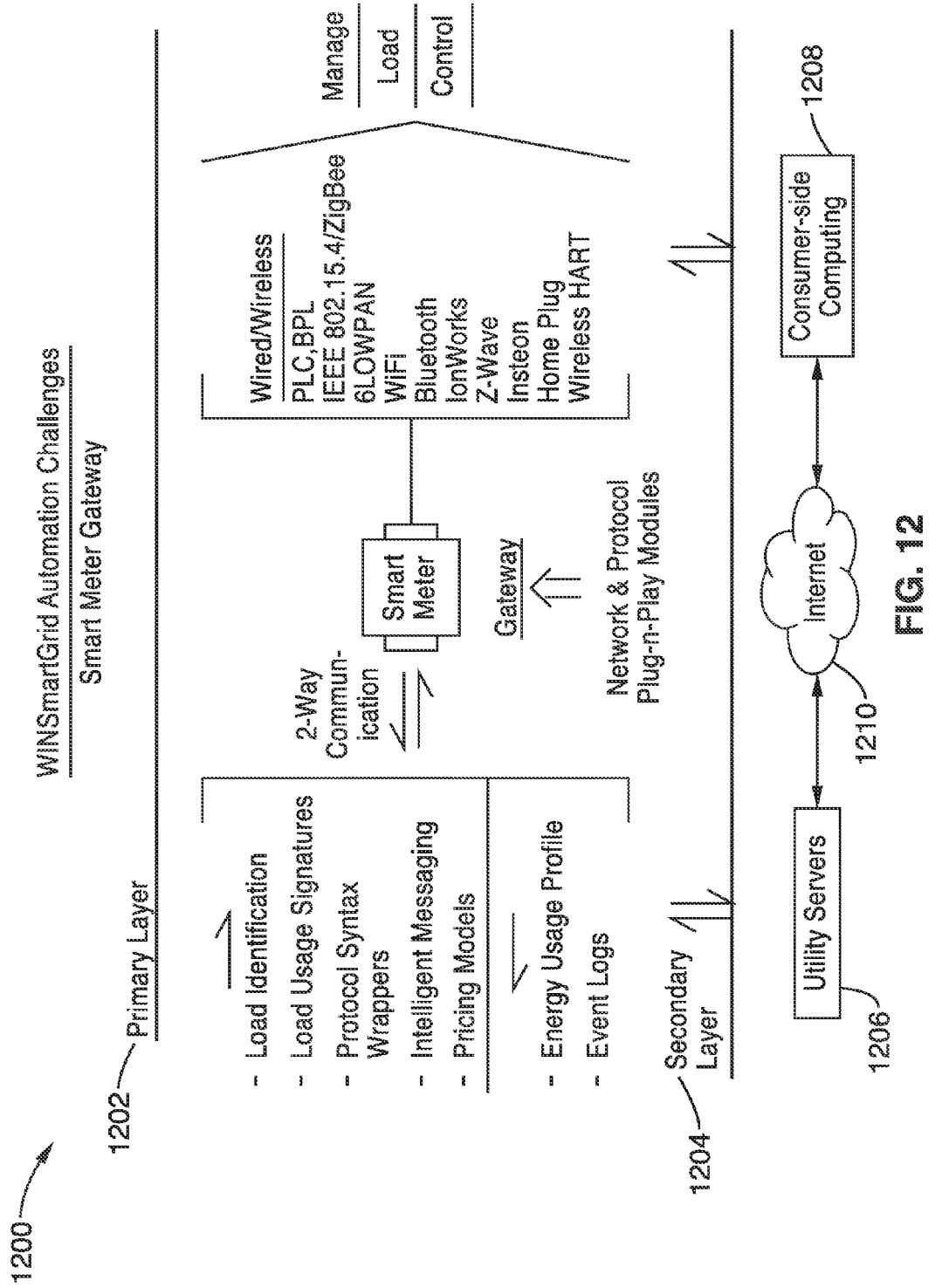
FIG. 12 is a diagram of a primary and secondary layer for the WINSmartGrid automation system according to an embodiment of the invention.

Refer now to FIG. 12, which is a diagram 1200 of a primary layer 1202 and secondary layer 1204 for the WINSmartGrid automation system according to an embodiment of the invention. Here, in particular, one sees that the utility servers 1206 communicate with consumer-side computing 1208 via the Internet 1210.

Figure 13:
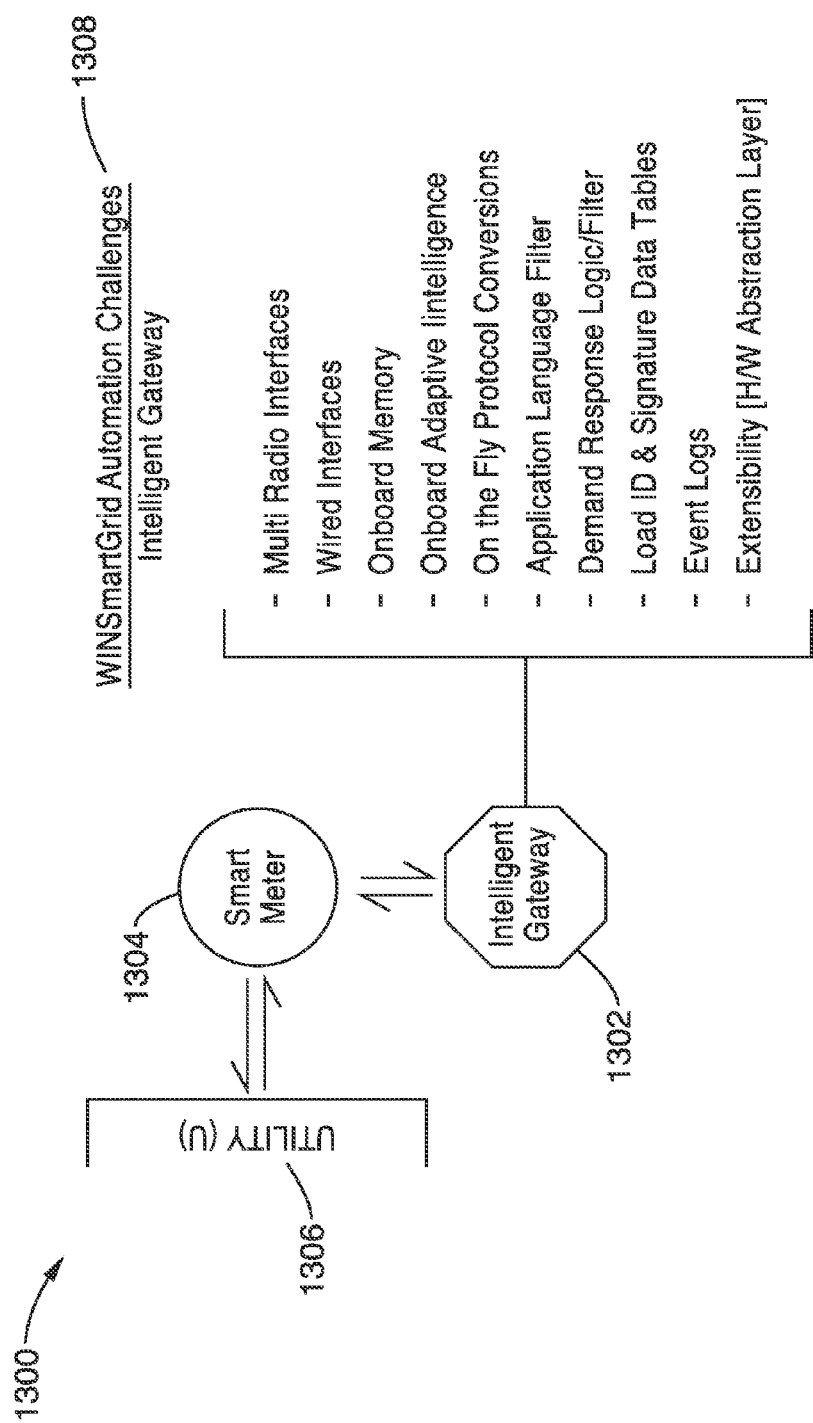
FIG. 13 is a diagram of a WINSmartGrid intelligent gateway according to an embodiment of the invention.

Refer now to FIG. 13, which is a diagram 1300 of a WINSmartGrid intelligent gateway 1302 according to an embodiment of the invention. Here, for instance, a smart meter 1304 has bidirectional communications with both the utility 1306 and the intelligent gateway 1302.

Attributes of the intelligent gateway 1302 include, but are not limited to: multiple radio interfaces, wired interfaces, onboard memory, onboard adaptive intelligence, on-the-fly protocol conversions, application language filters, demand response logic and filters, load identification and signature data tables, event logs, and extensibility through use of a hardware abstraction layer.

B. Universal State of Charge Calculation Method for Batteries

1. Introduction

Renewable energy has become a national goal for the United States of America. It has been anticipated that by 2015 10% of the total energy consumption in the nation will come from renewable sources, and the number will increase to 25% by 2025. One bottleneck is energy storage, as the peak time of energy harvesting is not necessarily the same as that of energy consuming. The battery is probably the most widely used energy storage device.

The market of rechargeable batteries has developed rapidly. In addition to the traditional drive for the demand of batteries from portable products, such as notebook computers, cellular and cordless phones, and camcorders, latest trends in other markets also push the demand for batteries. One example is the rise of hybrid electric vehicles (HEV), which uses an internal combustion engine (ICE) and one or more electric motors with battery packs to power the vehicles. Compared to standard vehicles driven by ICEs, HEVs have improved fuel economy and reduced emissions.

In order to make more efficient use of the battery energy, the state of charge (SOC) is ideally used in a battery management system (BMS) to regulate the charging and discharging of a battery. SOC indicates the amount of energy currently available in the battery in the form of a percentage. It can be used as input for a charging method as an indication that the battery is full.

State of charge (SOC) is an important variable in the WINSmartEV and WINSmartGrid previously discussed. Since SOC is so very important, it is better addressed separately here.

An accurate and reliable SOC estimation also tends to prolong the time the user of a portable product will wait until recharging the battery. SOC is beneficial for the cycle life of the battery due to less frequent recharging. Prediction of power will also be available on a HEV to satisfy the urgent requirement of power and to improve the quality of service of the automobile.

Despite its ever-increasing importance, many challenges remain unsolved to characterize and manage the battery. Among them, one fundamental issue is the estimation of the state of charge (SOC).

Figure 14:
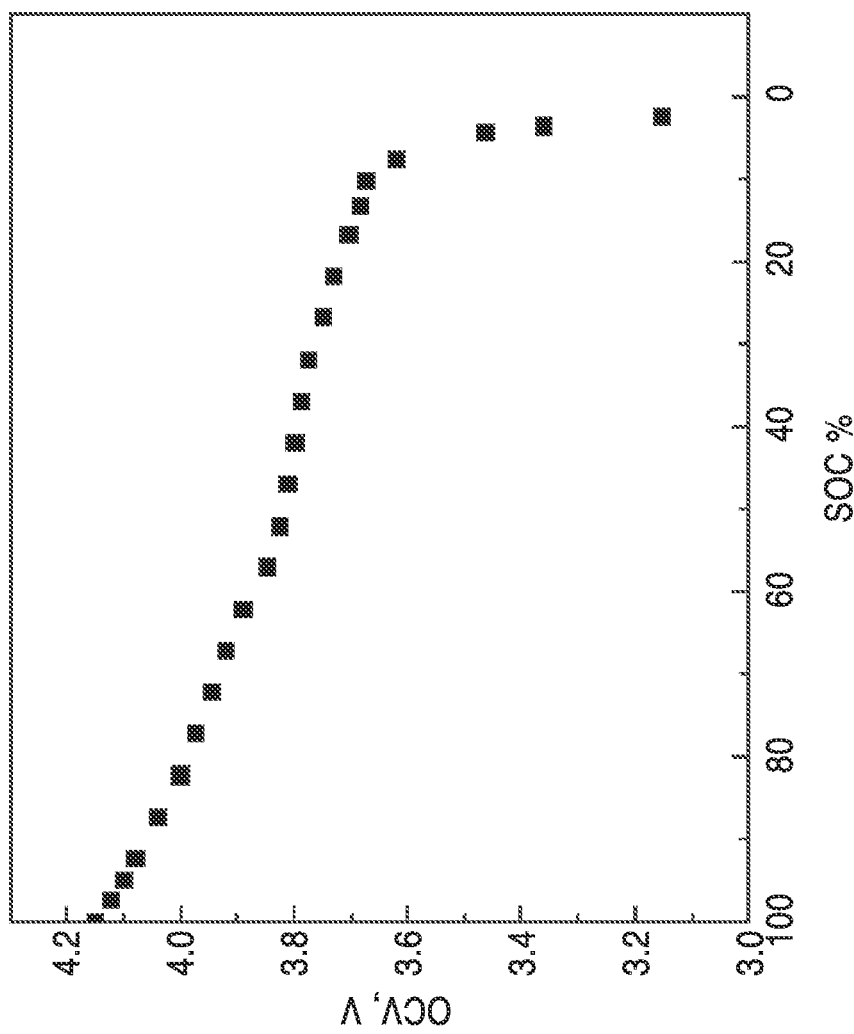
FIG. 14 is a graph of reference open circuit voltage (ROCV) versus reference state of charge (RSOC) measured during a complete discharge cycle for a typical lithium ion battery.

Refer now to FIG. 14, which is a graph of open circuit voltage (OCV) versus the state of charge (SOC) for a typical lithium ion battery. This shows a nonlinear relationship between the dependent and independent variable.

SOC, represented in percentage, indicates the amount of energy available in the battery. It is needed for controlling battery-powered systems. For example, the battery of a hybrid car should be charged with 20% SOC 95%. It is also used in dynamic power management, battery scheduling, battery-efficient communication traffic shaping and routing for circuits and IT systems.

Figure 15A:
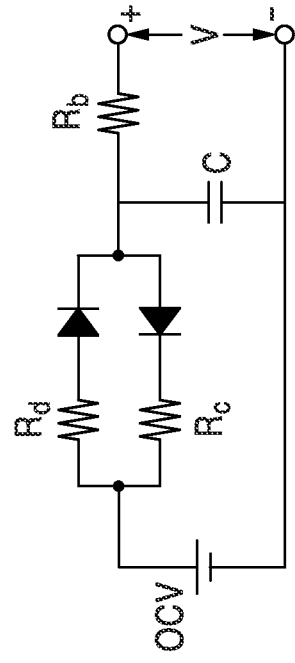
FIG. 15A is a schematic of an RC model of a battery.
Figure 15B:
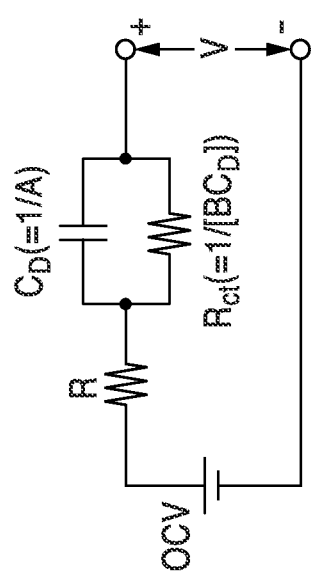
FIG. 15B is a schematic of a nonlinear model of a battery.
Figure 15C:
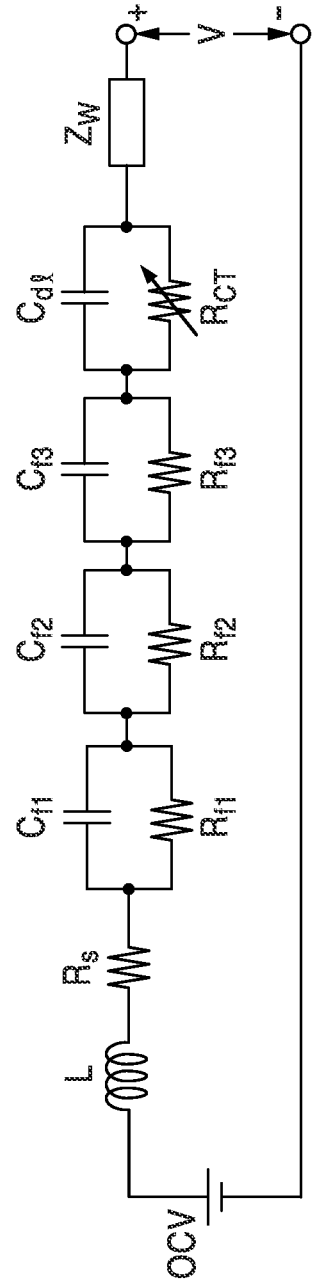
FIG. 15C is a schematic of a battery RC network model.

Refer now to FIG. 15A through FIG. 15C, which are respectively schematics of: A) an RC model, B) a nonlinear model, and C) a battery RC network model commonly found in the literature.

There have been many attempts in literature to estimate SOC by synthesizing circuit models based on measured voltage and current at battery terminals. For example, one reference uses an extended Kalman filter, another employs a circuit model containing resistances, capacitors and diodes, and a third combines voltage translation via a first-order RC network and coulomb counting by integrating current over time. The circuit models have to be time variant as battery SOC has a strong history and temperature dependency.

However, these circuit models that mimic the behavior of the battery (see FIG. 15A through FIG. 15C) face the following problems. First, the simplified models cannot exactly match the performance of the battery. The estimation error gets increasingly larger until the algorithm breaks down. Second, to perform real-time estimation, initial model parameters must be set properly to ensure the convergence of the algorithm. These parameters are quite sensitive to battery types and discharge current profiles, and can affect the algorithm robustness significantly. Researchers have been well aware of these problems for decades. To avoid using circuit models, a recent work applied a radial basis function (RBF) neural network. However, the parameters in the network still need to be properly chosen to guarantee the convergence, and there is no guarantee of accuracy, stability or robustness.

In contrast, we developed a universal yet efficient OCV-SOC calculation method by system analysis in the frequency domain without using any circuit models for batteries. The battery open circuit voltage is directly extracted from the voltage and current at the battery terminals. Then SOC can be inferred from OCV, a well-established practice in the field. The only assumption made is that the SOC is constant within a time window of certain width and the battery is a linear or weakly non-linear system. Features of our OCV-SOC calculation method described herein include:

(a) The method does not require any off-line training or initial setup, and can be applied to any battery type with any discharger current profile;

(b) Even if a large estimation error has occurred at certain time due to unexpected environmental change, the OCV-SOC calculation method can quickly converge to the correct SOC; and (c) The complexity of the OCV-SOC calculation method is low and it can be used as a real-time electro-analysis tool for battery diagnosis.

Experimental results show that the SOC can be extracted on-line with less than 4% error for different battery types and discharge current.

2. Background of OCV and SOC

A good example for the general framework for SOC estimation by combining two types of estimation methods is, i.e., $$SOC = \alpha SOC_c + (1-\alpha) SOC_v \qquad (1)$$

where $SOC_c$ is the Coulomb-counting based SOC and $SOC_v$ is the voltage-based SOC. $\alpha$ ($\in[0,1]$) is the weight factor. $SOC_c$ is estimated based on the amount of charge that has been extracted from the battery, and can be simply calculated as $$SOC_c(t) = SOC_c(0) - \frac{1}{Q}\int_0^t I(t)dt \qquad (2)$$

where Q is some constant to relate the current with charges.

$SOC_v$ is the estimation based on the open circuit voltage (OCV) of the battery, which is defined as the voltage between the anode and cathode of the battery when there is no external load connected and no external current between the terminals, even though there may be current internally (e.g., self-discharge current). It has been shown in many studies that there is a time-independent bijection between OCV and SOC. For example, the relationship between OCV and SOC may be given as $$OCV(t) = aSOC(t) + b \qquad (3)$$

where variables a and b are experimentally determined constants.

Refer again to FIG. 14, which is a graph of a reference open circuit voltage (ROCV) versus the state of charge (SOC) of a lithium ion battery. Clearly, $SOC_c$ has a strong dependency on history, and $SOC_v$ is less dependent and is therefore needed to avoid error accumulation over time and to correct major upsets in $SOC_c$. However, it may not be feasible or desirable to disconnect the battery from the load and measure its OCV from time to time. Therefore, it is necessary to find out some alternative approach that can obtain the OCV directly from measured voltage and current data while connected to active battery loads. Towards this end, many different approaches have been proposed, all of which are based on certain types of simplified battery models.

Refer now to FIG. 15A, which is a schematic for an RC pair battery equivalent. This simplified RC pair is used in connection with a resistor and a voltage source to model the battery. R is the battery resistance and $R_{ct}$ in series with $C_o$ approximate mass-transfer impedance. All the elements are time-variant according to the SOC, and are obtained by online regression from the measured voltage and current. Note that the voltage source value is exactly the OCV. Unfortunately, the model ignores many effects such as the Warburg potential that models the diffusion. Additionally, the model only works well for certain cases.

Refer now to FIG. 15B, which is a nonlinear model of a battery. FIG. 15B and FIG. 15C model the chemical diffusion of the electrolyte within the battery (i.e., it is not a purely electrical capacitance). The resistances $R_b$, $R_c$ and $R_d$ model all forms of energy loss in the battery (i.e., electrical and nonelectrical losses); The diodes allow for $R_c$ to be the value of resistance for charging and $R_d$ the value of resistance for discharging and have no physical significance in the battery except for modeling purposes.

Refer now to FIG. 15C, which is a schematic of an RC network model of a battery. In FIG. 15C, $R_s$ represents the ohmic resistance of the battery, including the electrolyte, electronic contacts, particle-to-particle contact resistance, etc.; $R_n$ and $C_n$ describe the slow migration of Li$^+$ through the surface films; $R_{ct}$ and $C_{dl}$ represent the Faradaic charge transfer resistance and double-layer capacitance of the electrodes, respectively. The diffusion impedance $Z_W$ of the anode and cathode models Warburg diffusive behavior. Both models are overly complicated and even so cannot guarantee convergence of the model to a physical battery.

In general, both models used in FIG. 15B and FIG. 15C are developed for specific types of batteries, and parameters need to be tuned for individual batteries due to process variations.

3. Method for Determining State of Charge (SOC)

Batteries may in general be considered slowly time-varying nonlinear systems with a voltage source. Within a short time window, one can assume that a battery can be treated as a time-invariant linear system where the SOC and accordingly the OCV can be treated as constant. As such, a window based OCV extraction technique is developed here.

For simplicity, although all functions to be discussed in this section are time-discrete, time-continuous notations, e.g. v(t), will only be loosely used, and explicitly expressed as discrete samples, e.g. $v(t_1)$, $v(t_2)$, ..., only when necessary. To avoid confusion, the "*" symbol is used to denote convolution and "x" to denote multiplication.

From the superposition theorem, in each time window the terminal voltage v(t) of a battery can be decomposed as $$v(t) = v_{zi}(t) + v_{zs}(t) \qquad (4)$$
$$= v_{zi}(t) + h(t) * i(t) \qquad (5)$$

where $v_{zi}(t)$ is the zero-input response corresponding to the terminal voltage with no discharge current, and $v_{zs}(t)$ is the zero-state response corresponding to the terminal voltage with discharge current i(t) as input and the voltage source shorted. h(t) is the impulse response of the linear system modeling the battery. Note that the validity of the convolution in (5) is based on the assumption of linearity. All existing works try to explicitly express h(t) as some analytical functions obtained from the detailed battery model. In this paper, the OCV is extracted without using any model.

At this moment, assume that the SOC will be extracted in the time window $0 \le t \le t_w$, and at t<0 the discharge current is always zero. This assumes that before t=0 the battery is disconnected from the load. This initial assumption will be removed later as the window is shifted. With this assumption and ignoring the self-discharge effect, the zero-input response is actually the open circuit voltage, i.e., $$v_{zi}(t) = OCV \times u(t), \ 0 \le t \le t_w \qquad (6)$$

where u(t) is a unit step function $$u(t) = \begin{cases} 1, & t \ge 0 \\ 0, & t < 0 \end{cases} \qquad (7)$$

The multiplication of u(t) indicates that the only interest is in the t≥0 region. This will facilitate the method, as will later be shown. To see how this can be done, first search for an f(t) which satisfies $$f(t) * i(t) = \delta(t) \ 0 \le t \le t_w \qquad (8)$$

where $\delta(t)$ is the Dirac delta function, i.e., $$\delta(t) = \begin{cases} 1, & t = 0 \\ 0, & t \ne 0 \end{cases} \qquad (9)$$

Note that f(t) is required to satisfy (8) only in the window, and the equality does not need to hold outside it.

The time-discrete method to solve for f(t) is illustrated in Method 1, where n is the total number of sampling points in the window and $t_1, t_2, \ldots, t_n$ are the sampling time points. The key idea here is to "inverse-convolute" the samples. The process is similar to that of solving the inverse of a matrix using elementary transformation. Again, the only requirement is that the convoluted result to be equal to the delta function within the window.

Method 1 for calculating f(t).

```
1: INPUT: Sampled i(t_j), 0 ≤ t_1 < ... < t_n ≤ t_w
2: OUTPUT: f(t_j), 0 ≤ t_1 < ... < t_n ≤ t_w
3: for j = 1 to n do
4:    f_norm(t_j) = f(t_j) = (t_j)/i(t_1)
5:    i_norm(t_j) = i_f(t_j) = i(t_j)/i(t_1)
6: end for
7: for i = 2 to n do
8:    for j = n to i do
9:       f(t_j) = f(t_j) - f_norm(t_{j-i}+1)i_f(t_i)
10:      i_f(t_j) = i_f(t_j) - i_norm(t_{j-i}+1)i_f(t_i)
11:   end for
12: end for
```

With f(t), one can compute $v_f(t)=f(t)*v(t)$ from (4)-(7) as $$v_f(t) = f(t) * v(t) \quad (10)$$
$$= f(t) * [OCV * u(t) + v_{zs}(t)] \quad (11)$$
$$= OCV \times u_f(t) + f(t) * v_{zs}(t) \quad (12)$$
$$= OCV \times u_f(t) + f(t) * i(t) * h(t) \quad (13)$$
$$= OCV \times u_f(t) + \delta(t) * h(t) \quad (14)$$
$$= OCV \times u_f(t) + h(t) \quad 0 \le t \le t_w \quad (15)$$

where uf (t) is marked as $$u_f(t)=f(t)*u(t). \quad (16)$$

The frequency-domain response of the battery can be considered as finite as reported by measured response spectrum. Then according to the final value theorem, one has $$\lim_{t \to \infty} h(t) = \lim_{s \to 0} sH(s) = 0. \quad (17)$$

Accordingly, $$\lim_{t \to \infty} \frac{v_f(t)}{u_f(t)} = OCV. \quad (18)$$

This means that when a large t is used, h(t) approaches zero and $$\frac{v_f(t)}{u_f(t)}$$

gives a good approximation of OCV in the current time window. In practice, choose a time point where $u_f(t)$ reaches its maximum (so that the error introduced by non-zero h(t) is minimized) in the window to evaluate OCV.

After the extraction of OCV, the impulse response of the system in the current time window may be acquired:

$$h(t)=v_f(t)-OCV \times u_f(t) \quad (19)$$

Note that h(t) obtained from the above equation can only be accurate when t is small (|h(t)| is large). Since one cannot really calculate OCV at t=∞, the error in obtained OCV can become significant at large t when h(t) gets close to zero. In practice, h(t) is simply set to zero when $|h(t)| \le \epsilon$ where $\epsilon$ is a small positive value.

The impulse response of batteries contains complete information regarding the behavior of batteries. Maximum future available power can be estimated directly from the impulse response, and the state of charge (SOC) of the batteries can be tracked easily. The state of health (SOH) (or figure of merit) of batteries can also be tracked easily by looking at the decrease in maximum future available power as the batteries age.

After finishing the OCV extraction in the current window, the same process can be repeated to extract the OCV in the next window. However, it is necessary to remove the assumption that the discharge current is always zero before the window. The history discharge current will impact the zero-input response in the current window, as the battery cannot return to steady state immediately. Accordingly, one needs to remove from the samples the voltage response caused by the history current in the previous window. Since there is already the impulse response in the previous window (19) available, as well as the discharge current in the current window, the removal can be conducted as follows:

$$v'(t)=v(t)-\int_{t-t_e}^{t_w} i(\tau)h(t-\tau)d\tau \quad (20)$$

where $t_e$ is the end time of the previous window. After this process, the system can be modeled again as a system with zero-input before the current time window. The OCV method described above can be repeated by using i(t) and v'(t) instead of v(t) to extract the OCV as well as to update the impulse response.

Clearly, the only situation where the above method will fail is in that $u_f(t)$ also converges to zero as t approaches infinity. If $u_f(t)$ is always zero for $t \ge t_0$ with some $t_0$, or to be more specific, if $u_f(t_i)$, the time-discrete samples of $u_f(t)$, are zeros for $i \ge 2$, then the method breaks down. However in this case the corresponding discharge current is actually constant and has component only at s=0 in the frequency domain. It becomes impossible to extract OCV for any voltage-based extraction methods.

Fortunately, the battery model becomes almost a resistance network when the discharge current is approximately constant. OCV can then be simply calculated as $$OCV=V(t)-I(t)R_{\mathit{eff}} \quad (21)$$

where $R_{\mathit{eff}}$ is the effective terminal resistance. There is a unique mapping between the $R_{\mathit{eff}}$ and the SOC. Accordingly, from the previous extracted SOC and assuming that SOC and $R_{\mathit{eff}}$ vary slowly with time, one can obtain the $R_{\mathit{eff}}$ in the current window from table-look-up. Then from (21) the new OCV can be obtained.

4. Implementation And Analysis 4.1 Further Speedup

In the method described above, the bottleneck of runtime is mainly in the step to solve $f(t)*i(t)=\delta(t)$ for f(t) and the following step to calculate $v_f(t)=f(t)*v(t)$ and $u_f(t)=f(t)*u(t)$. Actually these two steps can be combined into one and there is no need to explicitly calculate f(t).

The overall method is shown in Method 2, where n is the total number of sampling points in one window. For the simplicity of presentation, the first time window $0 \le t \le t_w$ is still used as an example.

Method 2 simultaneously combines the steps of deconvolution and convolution for a more efficient computation of the OCV, resulting in basis of the OCV-SOC calculation method.

```
 1: INPUT: Sampled i(t_i), v(t_i), 0 ≤ t_1 < ... < t_n ≤ t_w
 2: OUTPUT: v_f(t_i), u_f(t_i), 0 ≤ t_1 < ... < t_n ≤ t_w
 3: for j = 1 to n do
 4:     v_norm(t_j) = v_f(t_j) = v(t_j)/i(t_1)
 5:     u_norm(t_i) = u_f(t_i) = u(t_i)/i(t_1)
 6:     i_norm(t_j) = i_f(t_j) = i(t_j)/i(t_1)
 7: end for
 8: for i = 2 to n do
 9:     for j = n to i do
10:         v_f(t_j) = v_f(t_j) − v_norm(t_{j−i+1})i_f(t_i)
11:         u_f(t_j) = u_f(t_j) − u_norm(t_{j−i+1})i_f(t_i)
12:         i_f(t_j) = i_f(t_j) − i_norm(t_{j−i+1})i_f(t_i)
13:     end for
14: end for
```

Furthermore, the time complexity of the method is $O(n^2)$, where n is the number of samples. Note that both of the two for-loops with the variable j can be computed in parallel and thus it is possible to reduce the complexity further to $O(n)$ with parallel computing platform.

Figure 16:
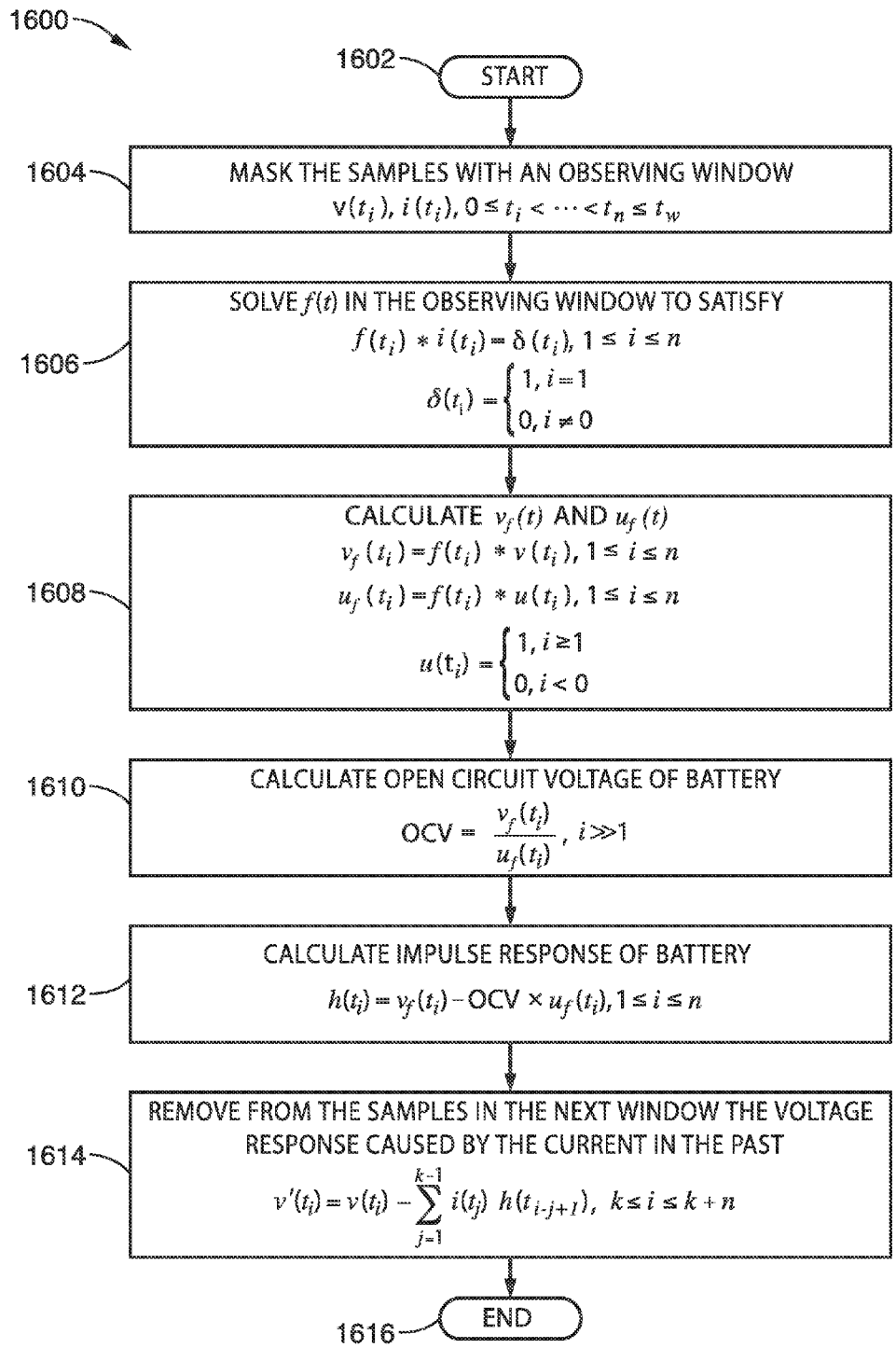
FIG. 16 is a flowchart for determining the open circuit voltage (OCV) of a battery according to embodiments of the invention.
Figure 17B:
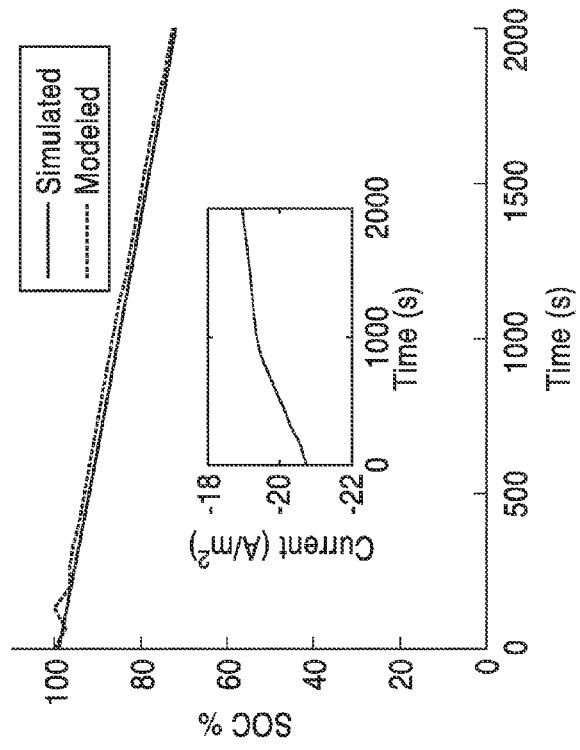
FIG. 17B is a graph comparing the state of charge (SOC) for a simulated and modeled battery undergoing a constant load discharge according to the teachings herein.
Figure 17A:
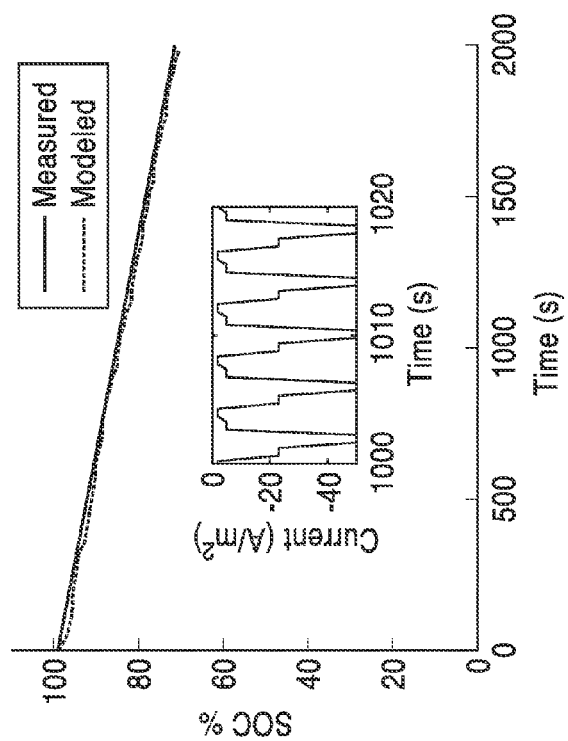
FIG. 17A is a graph comparing the state of charge (SOC) for a measured and modeled battery undergoing a periodic discharge according to the teachings herein.
Figure 17C:
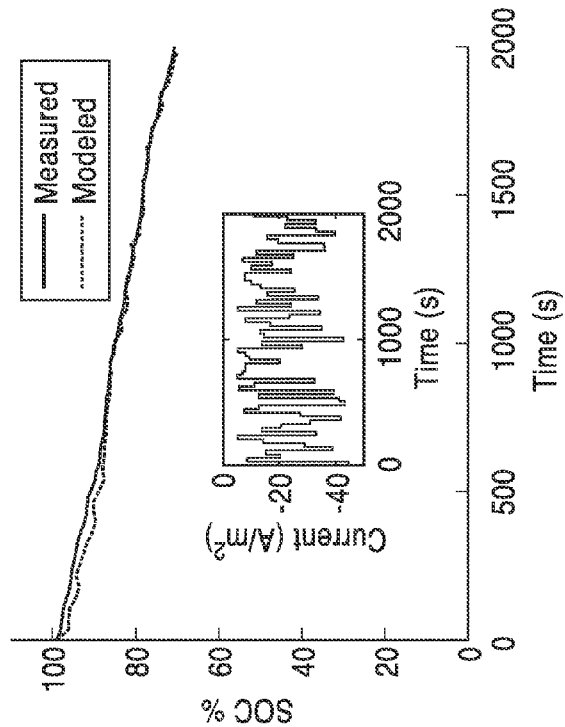
FIG. 17C is a graph comparing the state of charge (SOC) for a simulated and modeled battery undergoing a constant power discharge according to the teachings herein.
Figure 17D:
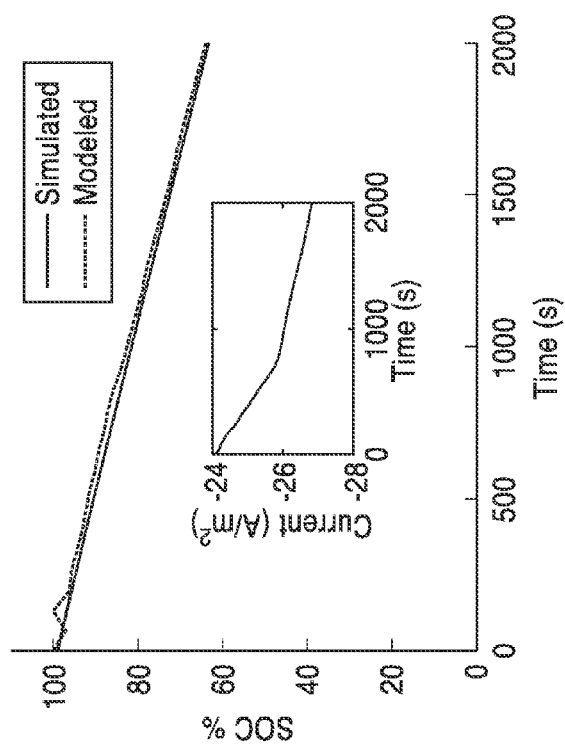
FIG. 17D is a graph comparing the states of charge (SOC) for a simulated and modeled battery undergoing a piecewise constant power discharge according to the teachings herein.

Refer now to FIG. 16, which is a flowchart 1600 for determining the open circuit voltage (OCV) of a battery according to the methods taught herein. This flowchart follows the method 2 previously discussed. The method starts 1602 by masking 1604 the samples with an observing window to obtain $$i(t_i), v(t_i), 0 \le t_1 < \ldots < t_n \le t_w.$$

Next, we solve 1606 $f(t_i)*i(t_i)=\delta(t_i)$ $0 \le i \le n$ in the observing window where $\delta(t_i)$ is the Dirac delta function, i.e., $$\delta(t_i) = \begin{cases} 1, & i = 0 \\ 0, & i \ne 0. \end{cases}$$

Next 1608, we calculate $v_f(t)$ and $u_f(t)$ by
$v_f(t_i)=f(t_i)*v(t_i)$, $1 \le i \le n$ and $u_f(t_i)=f(t_i)*u(t_i)$, $1 \le i \le n$ where $$u(t_i) = \begin{cases} 1, & i \ge 0 \\ 0, & i < 0. \end{cases}$$

We calculate 1610 the battery open circuit voltage (OCV) by:

$$OCV = \frac{v_f(t_i)}{u_f(t_i)}, i \gg 1.$$

The impulse response of the battery is calculated 1612 by:

$$h(t_i) = v_f(t_i) - OCV \times u_f(t_i), 1 \le i \le n.$$

Next, we remove 1614 from the samples in the next window from the response caused by the current in the past by:

$$v'(t_i) = v(t_i) - \int_{j=1}^{k-1} i(t_j)h(t_{i-j+1}).$$

Finally, we exit 1616 the calculation.

4.2 Numerical Stability

The numerical stability of the method depends mainly on whether $i(t_1)$ is too small to keep the division in Method 2 accurate. However one can always select the starting point of the window where $i(t_1)$ is not so small. The worst case is that the current keeps close to zero so that one cannot find a proper starting point. In this case the state of the system is close to an open circuit condition, and the OCV can be approximated by the terminal voltage; therefore the problem is not a concern.

4.3 Robustness

Suppose there occurs an error $\epsilon$ at the $k^{th}$ extraction of OCV. Let $OCV_{err} = OCV_{org} + \epsilon$. $\epsilon$ spreads to the $(k+1)^{th}$ extraction via the $k^{th}$ impulse response $h_{err}(t) = h_{org}(t) - \epsilon u_f(t)$. If all of the n samples in $h_{err}(t)$ are used to remove the impact of the discharge current in the previous window, then combining (16) and (8), it is easy to see that the error in (20) accumulated via v'(t) is also bounded by $\epsilon$. Accordingly, the error will never accumulate as the window shifts.

In addition, as claimed previously, one can directly set h(t) to zero at large t, so the error spread on large t is removed and only that on small t is spread to the $(k+1)^{th}$ extraction. This mechanism further speeds up the convergence of the method. Supposing the samples of h(t) are kept at a ratio of $\eta$ and also assuming that the error is uniformly distributed on each sample which is an ideal case, the convergence time would be $$t_{conv} = t_w \log_{\eta-1}\left(\frac{\epsilon_{init}}{\epsilon_{end}}\right),$$

where $\epsilon_{init}$ is the initial error and $\epsilon_{end}$ is the tolerance bound.

4.4 Applicability to Different Battery Types

No specific circuit models are assumed by this calculation. When the method is applied to a battery with new materials, there is no need to adjust any part of the method. This will be further verified by experiments later. Note that a measurement of a complete discharge process is needed to characterize the mapping between SOC and OCV for the new battery.

4.5 Inhibition on Non Ideal Factors

Though it was previously assumed that the system should be time-invariant within a window, the method actually has a natural inhibition to errors introduced by this assumption.

To illustrate this clearly, the equation used to calculate $v_f(t)$ is rewritten in a matrix form as $$\begin{pmatrix} i(t_1) & i(t_2) & \ldots & i(t_n) \\ 0 & i(t_1) & \ldots & i(t_{n-1}) \\ \vdots & \vdots & \ddots & \vdots \\ 0 & 0 & 0 & i(t_1) \end{pmatrix} \begin{pmatrix} v_f(t_n) \\ v_f(t_{n-1}) \\ \vdots \\ v_f(t_1) \end{pmatrix} = \begin{pmatrix} v(t_n) \\ v(t_{n-1}) \\ \vdots \\ v(t_1) \end{pmatrix} \quad (22)$$

Since the inverse of an upper-triangular matrix is still upper-triangular, it is easy to infer that the deviation of the voltage response at $t_i$ due to non-ideal factors, $\delta v(t_i)$, will only impact $v_f(t_i), v_f(t_{i+1}), \ldots$, and all the samples before $t_i$ are still accurate. Accordingly, the samples at small t play a more critical role than samples at large t for OCV estimation. The deviation of v(t) at small t due to non-ideal factors is also small. This concludes that the calculation method can still be accurate even though the system is slowly varying in the time.

5. Experimental Results

Extensive experiments were conducted to demonstrate the promising performance of our OCV-SOC calculation method. The OCV-SOC calculation method was verified via dualfoil5, a popular battery simulator whose simulation result is very close to measurement data. The input of the simulator can be either detailed current waveform, load, or power at the terminal of a battery. The material of the battery used in simulation can be chosen from a library. The output of the simulator includes SOC and OCV of the battery as well as the current and voltage waveform at the terminal of a battery. The working platform of the experiment is MATLAB 7.01 running at a 1.73 GHz clock frequency.

5.1 Accuracy Verification

The accuracy of OCV calculation method is verified with four common discharge profiles of a battery, i.e., periodic discharge current similar to the one used in the literature, piecewise constant discharge current similar to the one reported in another one used in the literature, constant load of $0.2\Omega/m^2$, and constant power of $100 \, W/m^2$.

In the experiment MCMB 2528 graphite was chosen as the negative active material, $LiPF_6$ in EC:DMC (liquid) as the electrolyte and $CoO_2$ (Cobalt dioxide) as the positive active material. Before extraction of this type of battery, the lookup tables to map a reference open circuit voltage (ROCV) and the effective terminal resistance $R_{eff}$ to SOC are built based on simulation data offered by dualfoil5 through a discharge process from fully-charged to 15% SOC with a discharge current of $20 \, A/m^2$. Initially, set the length of the time window as 6s and the sampling interval as 0.06s (the smallest time step the battery simulator dualfoil5 can reach). The battery is first fully charged before conducting each experiment.

Refer now to FIG. 17A through FIG. 17D, which are graphs comparing the state of charge (SOC) for a measured and modeled battery undergoing: A) a periodic discharge; B) a constant load discharge; C) a constant power discharge; and D) a piecewise constant power discharge for the model described herein. The results of SOC extraction via the OCV-SOC calculation method are shown in the FIG. 17A through FIG. 17D. The figures show that the extracted SOC fits well in all the four situations. The OCV calculation method can, therefore, be used in most operation situations without any manual adjustment to extract the SOC, which was a big concern in most existing SOC estimation methods as pointed out in the literature.

5.2 Robustness

Refer now to FIG. 18A and FIG. 18B, which are respectively, the SOC and OCV errors with an initial error burst to further study the robustness of the OCV-SOC calculation method. In FIG. 18A, the initial OCV for the OCV-SOC calculation method was set to 3.584V (corresponds to 15% SOC) while the actual SOC at that time point is 100%. All the other experimental settings remain the same as FIG. 17D. From the figure one can see that the OCV-SOC calculation method converges quickly to the correct SOC. Similarly, the OCV error quickly returns to essentially 0%. This error-burst test shows that the OCV-SOC voltage-based method is more robust.

5.3 Runtime

The estimation time of the extraction mainly depends on the number of points in the observation window. Given the width of the window, the runtime is then decided by the sampling rate. The sampling rate is often set as high as possible to acquire more data points for more accurate extraction. However the runtime also increases with the increasing sampling rate. The upper limit of the sampling rate can be decided by the condition when the estimation time exceeds the sampling interval such that the extraction process cannot keep in pace with the sampling process. In this experiment, the width of the observation window is set to be 6s and the sampling interval is swept from 0.06s to 0.36s with a step of 0.06s. All the other experimental settings remain the same as FIG. 17D. The result is shown in FIG. 19.

Figure 19:
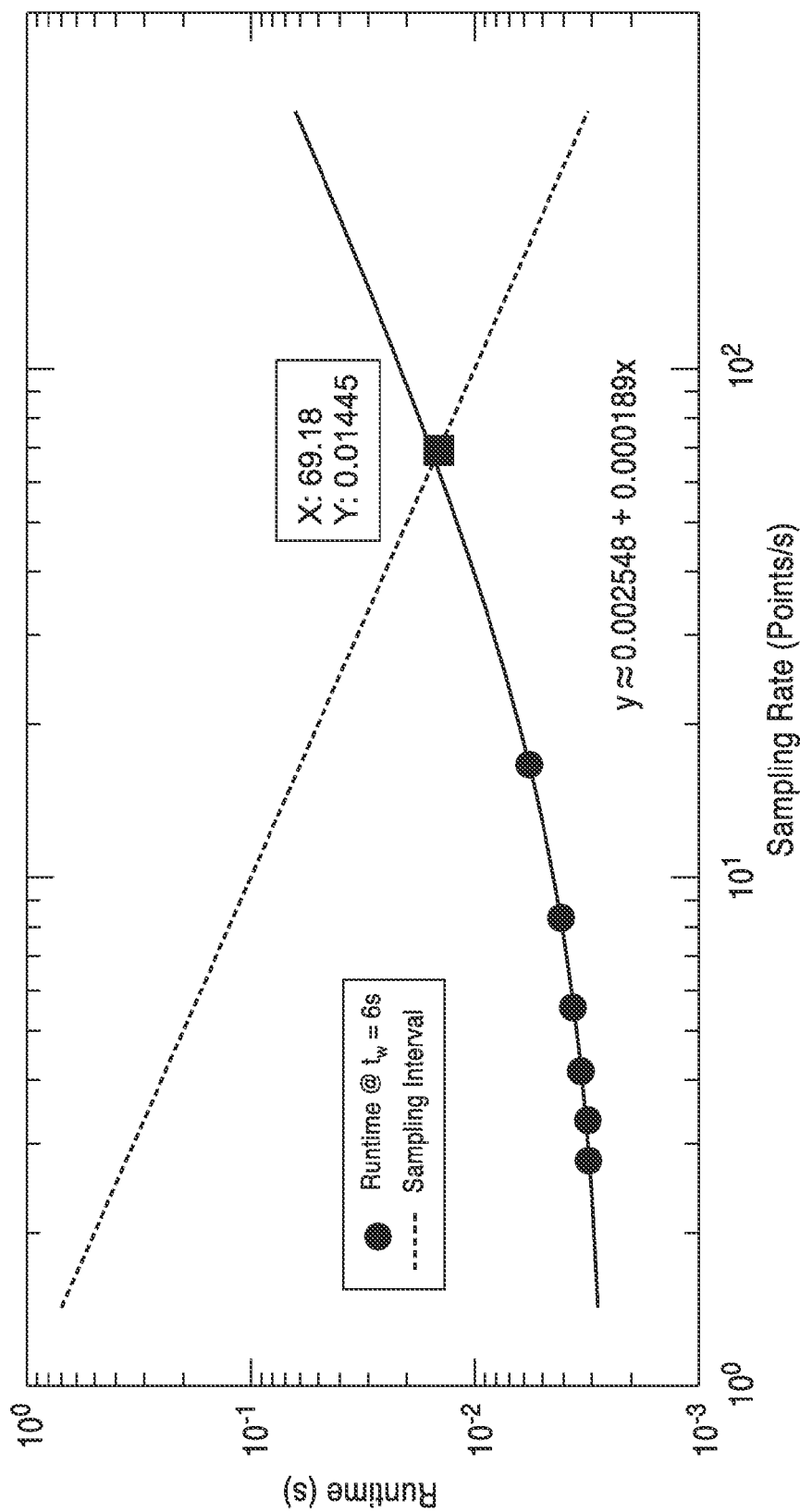
FIG. 19 is a graph showing the relationship between model runtime versus sampling rate, where the relationship is a linear regression of the semilogarithmic curve fit, showing an extrapolated upper limit of the sampling rate, according to the teachings herein.

Refer now to FIG. 19, which is a graph showing the relationship between model runtime versus sampling rate, where the relationship is a linear regression of the semilogarithmic curve fit, showing an extrapolated upper limit of the sampling rate. The upper limit of sampling rate is approximately 69 points per second, which means that SOC can be updated every 14 ms. It provides a promising prospect of the realization of online extraction of SOC, e.g. every 2 ms, when further speedup can be achieved after the transplantation of the OCV-SOC calculation method from MATLAB to C or hardware implementation.

5.4 Window Width and Sampling Rate

The selection of a proper window width is critical. It mainly determines the number of samples in a window and the corresponding accuracy within the window. There is a tradeoff between the window width and the accuracy. In this experiment, the sampling rate is set at 0.06s and the window width is tested at 0.12s, 1.2s and 12s, i.e. the number of samples in one window is 2, 20 and 200 respectively. All the other experimental settings remain the same as FIG. 17D. The result is shown in FIG. 20A.

Figure 20A:
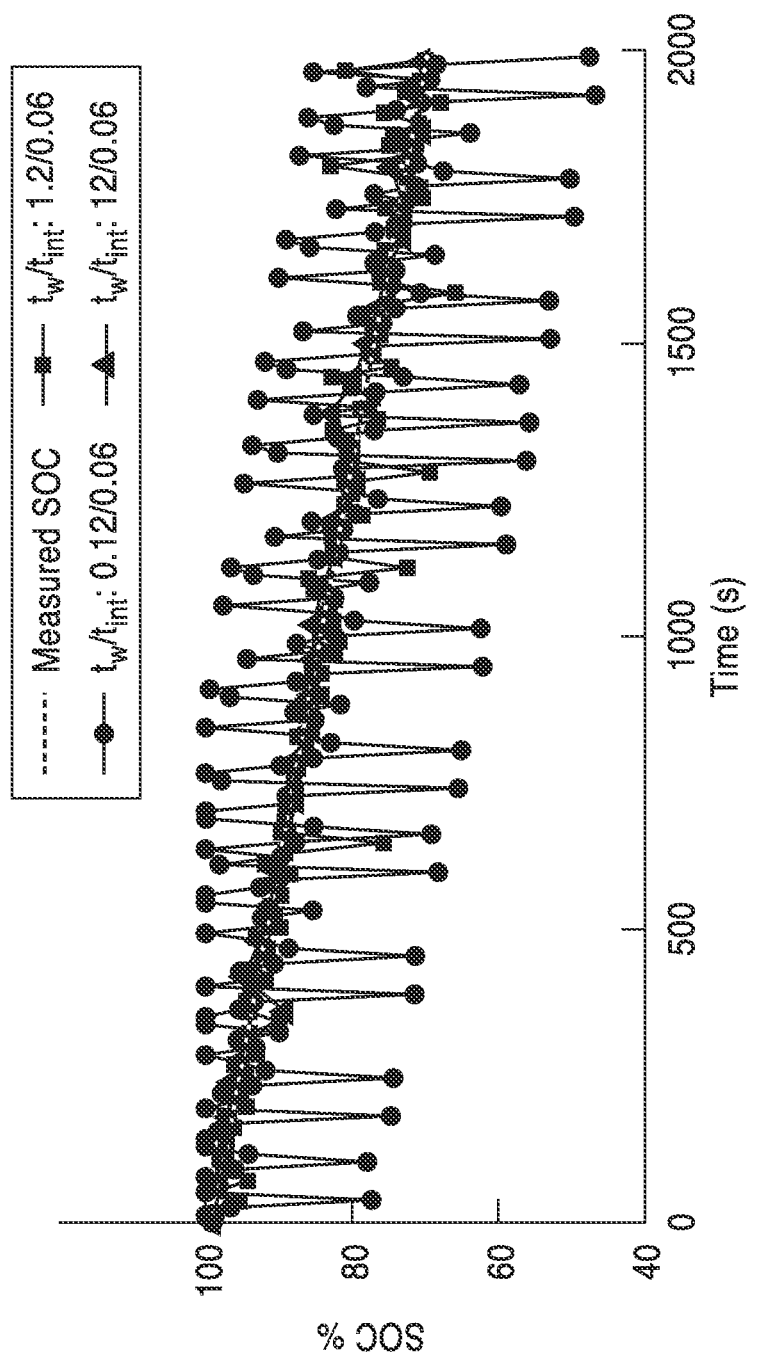
FIG. 20A is a graph of the state of charge (SOC) versus time for measured and modeled SOCs as the modeled window length is increased while the sampling rate remains constant, where $t_w$ is the window width and $t_{int}$ is the sampling interval, according to the teachings herein.

Refer now to FIG. 20A, which is a graph of the state of charge (SOC) versus time for measured and modeled SOCs as the modeled window length is increased while the sampling rate remains constant, where $t_w$ is the window width and $t_{int}$ is the sampling interval. It shows that the extraction result of SOC becomes inaccurate when the window width is too small. Therefore a proper window width can be decided such that there are at least tens of samples in the window to guarantee the accuracy.

Figure 20B:
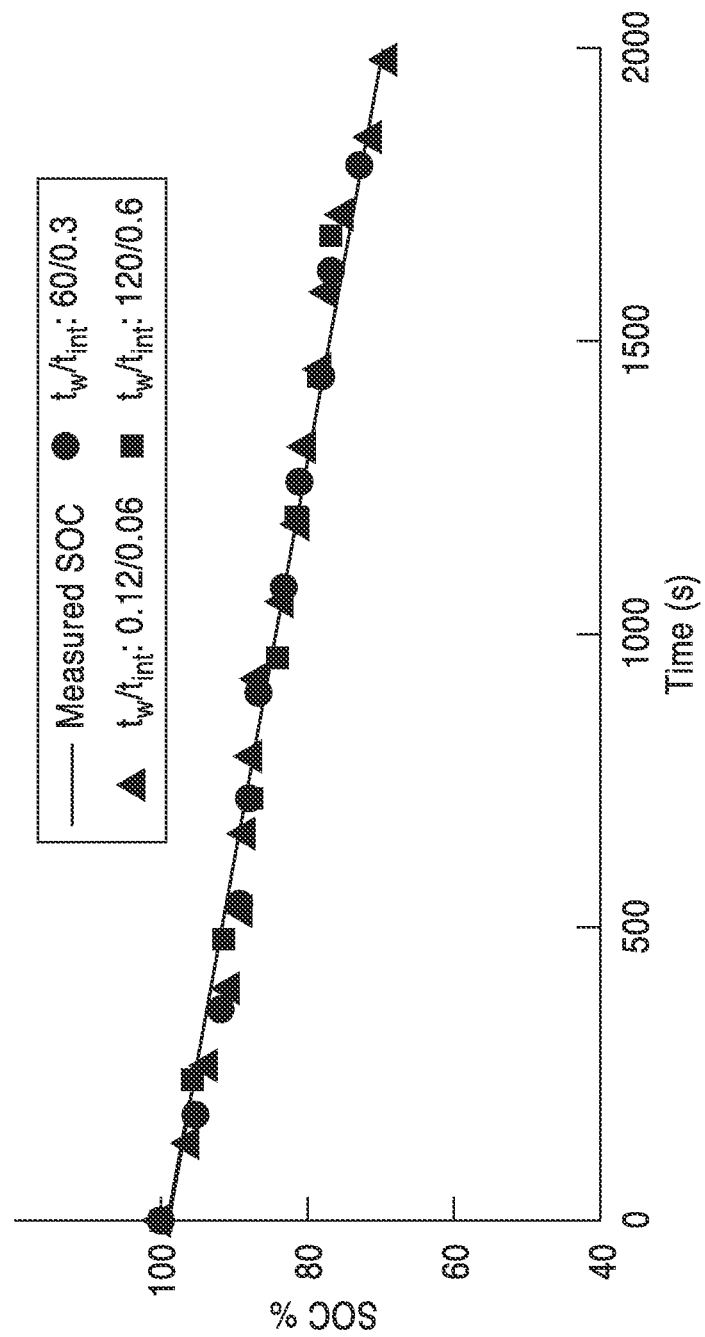
FIG. 20B is a graph of the state of charge (SOC) versus time for measured and modeled SOCs as the modeled window length is increased while the number of samples in the window remains constant, where $t_w$ is the window width and $t_{int}$ is the sampling interval, according to the teachings herein.

Refer now to FIG. 20B, which is a graph of the state of charge (SOC) versus time for measured and modeled SOCs as the modeled window length is increased while the number of samples in the window remains constant, where $t_w$ is the window width and $t_{int}$ is the sampling interval. For example, in FIG. 20B, the window width with 200 samples always obtains good accuracy for different sampling rates and can be processed in time concerning the result in section 5.3.

5.5 Applicability to Different Battery Types

Figure 21:
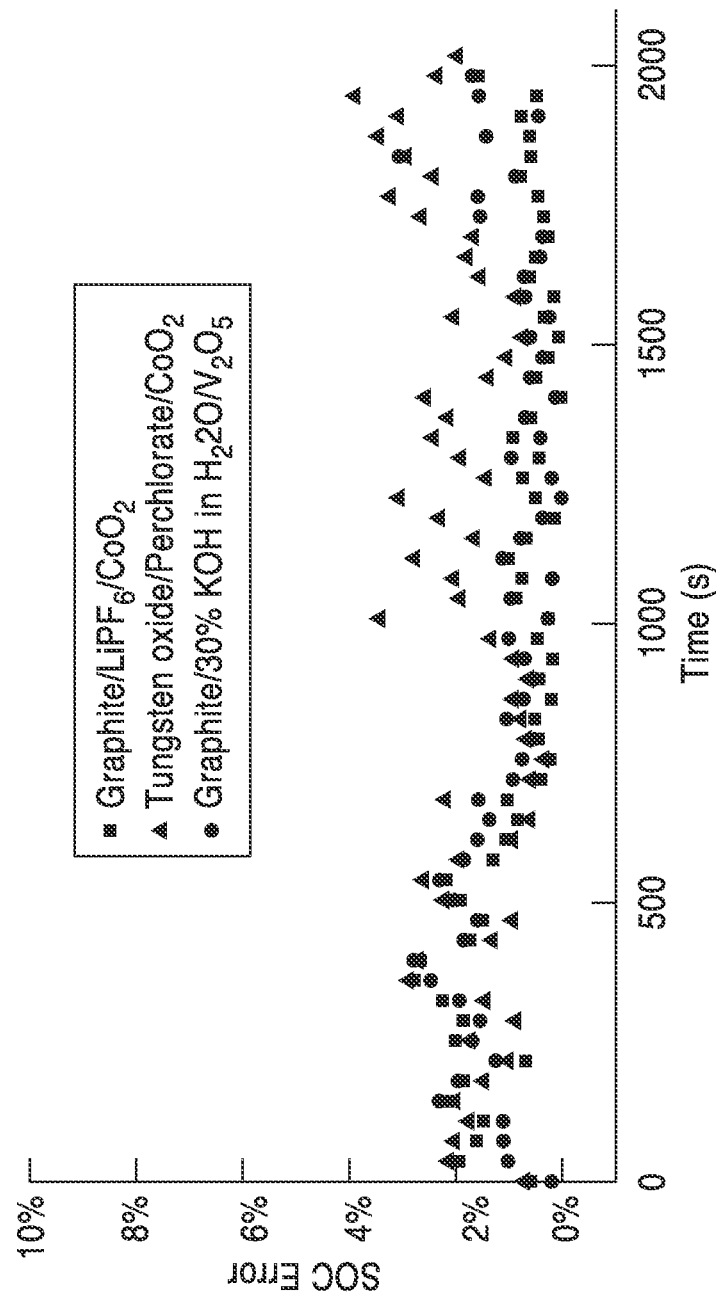
FIG. 21 is a graph of the state of charge (SOC) error versus time for three different modeled battery chemistries showing that SOC errors were typically below 4%, according to the teachings herein.

Refer now to FIG. 21, which is a graph of the state of charge (SOC) error versus time for three different modeled battery chemistries showing that SOC errors were typically below 4%. FIG. 21 shows the applicability of the OCV-SOC calculation method as studied against different battery types. Three kinds of combinations of battery materials were selected to act as the active positive material, the electrolyte and the negative positive material of a battery. The three combinations were Graphite/$LiPF_6$/$CoO_2$, which was used in the previous experiment, Tungsten oxide/Perchlorate/$CoO_2$ and Graphite/30% KOH in $H_2O$/$V_2O_6$. For each type of battery, a measurement of a discharge process from fully charged to 15% SOC was conducted and a new look-up table containing SOC, ROCV and $R_{eff}$ was built. No adjustment to cater manually the OCV-SOC calculation method to new battery types was used. All the other experimental settings remain the same as FIG. 17D. The results are shown in FIG. 22, where it can be seen that the error is always within an acceptable range of 4% regardless of the three different battery types, which strongly indicates that the OCV-SOC calculation method would be universally applicable to different battery types.

It can be seen, therefore, that we have developed an efficient yet accurate state of charge (SOC) calculation method based on the initial calculation of the open circuit voltage (OCV) that appears applicable to nearly all types of batteries and discharge profiles. Using linear system analysis but without a circuit model, first an open circuit voltage (OCV) based on the sampled terminal voltage and current of the battery is calculated, and then the SOC is obtained based on a mapping between an initial reference open circuit voltage (ROCV) and SOC. The OCV-SOC calculation method does not require any off-line training and can be applied to any battery type with any current profile. The OCV-SOC calculation method can also quickly converge to the correct SOC when a large estimation error occurs due to an unexpected environmental change. The complexity of the OCV-SOC calculation method is also low and can be used as a real time electro-analysis tool for Battery Management Systems (BMSs). The accuracy, efficiency, robustness and apparent universal applicability of the method has also been demonstrated.

A simple yet accurate method was presented to calculate open circuit voltage (OCV) based on terminal voltage and current of the battery. A frequency domain linear system analysis was used, but not any detailed circuit model. Accordingly, the OCV-SOC calculation method can likely be applied to any kind of discharge current profile and any battery types without modification. Experiments show that SOC can be obtained efficiently based on the well-established mapping between SOC and OCV, with less than 4% SOC error compared to the detailed battery simulations.

The present invention is able to automatically consider battery behavior changes caused by uncertainties such as temperature, manufacturing and aging. For example, the temperature impact can be addressed by incorporating the temperature dependent Nernst equation into the mapping between OCV and SOC. The universality of the OCV-SOC calculation method can also be used to perfectly balance parallel or serial cells in multi-cell battery architecture design for desired voltage and current capability.

C. Recent Developments

1. Technical Scope 1.1 Smart Charging

We have designed and implemented a communication and controlling application as part of the WINSmartEV research platform using the WINSmartGrid platform. WINSmartGrid is a sensing and controlling network architecture that has been developed for Smart Grid applications. WINSmartEV is a system that is focused on the integration of electric vehicles into the power grid application. WINSmartEV utilizes various wireless communication protocols to collect data such as Vehicle ID, status of charge, battery temperature, power usage in kW, voltage and amperage, and to send control signals to connect and disconnect a charger based on various inputs such as grid capacity, user preference, time of use, and demand respond events. Its unique features is that it provides a user interface to allow mobile devices to monitor and control electric vehicle's charging schema. An expert system which is part of the architecture, determines the optimized charging and backfill operations based on various inputs such as EV profile, user preference, demand respond event, grid capacities.

There are five demonstrations that are planned parts of the Smart Charging category. These demonstrations include Monitoring of All Chargers; Reading the Power Consumption for Vehicles that Are Connected to Chargers; Control Chargers (either by time or usage); Disconnect a Vehicle that is Charging; and Smart Charging through Mobile Interfaces.

1.1.1 Monitoring All Chargers

This architecture allows keeping in real-time the status of all chargers and indicating whether or not the charger is charging. There is an on-demand request to show the status of the charger and a daily transmittal of the duration of charges. This EV charger communicates to a control center.

Charging stations typically use proprietary communication protocols, and to resolve this problem our approach is an open architecture charging station that supports the data collection and circuit control of this project. WINSmartEV enabled charging stations provide the following functions:

(a) open architecture to collect user and vehicle profile, kW, usage history, etc.;

(b) battery aggregation: dynamic charging scheme based on various inputs;

(c) support both Level 1 and Lever 2 charging;

(d) include safety and security factors in the design; and (e) allow backfill integration controlled by WINSmartEV.

The architecture is intended to interface with commercial, off-the-shelf (COTS) chargers to collect charger data and integrate them with the data collected from WINSmartEV charger so that the control center can monitor all chargers in the system.

The control center architecture provides a web based visualization portal to monitor all charger status with graphical interface to indicate the geographical location and whether the charger is being used at a given point in time.

1.1.2 Reading The Power Consumption For Vehicles That Are Connected To The Chargers The WINSmartEV system architecture has the capability to monitor and store power consumption information for each vehicle that is connected to the chargers installed. Real time and historical data would allow one to store and collect data at the control center. The architecture will allow collection and smart aggregation of electric vehicles and chargers including: Vehicle ID, Charger ID, connection time stamp, current, voltage, kW, Status of Charge (SOC), battery temperature through the communication gateway and EV communication modules in WINSmartEV System. For detailed communication architecture and network information, refer back to FIG. 2B.

Vehicle ID collection in the system architecture is through: 1) RFID readers installed on the chargers; and 2) the RFID tag attached on the vehicle, when the vehicle is initially parked. Charger ID and connection time stamp is available at the same time when the vehicle is connected. User ID is available to the control center when the user activates the charger by using his/her identification card.

In the control center, the WINSmartEV architecture checks the eligibility of the connected vehicle and user profile to engage the charging operation. Eligibility is determined based on end user profile which contains user account balance, charging preference, charging history and also based on vehicle profile which contains vehicle make and model, battery profile, etc.

Once the vehicle and users are authorized, control center sends engage signal to the charger to activate charging. The smart meter or equivalent sensors on the charger continuously monitors the power consumption and sends real time data back to control center through a uniquely designed communication gateway at a 15 minute-interval and this interval is dynamically modifiable via a specific unique architecture. Various time intervals are determined based on the density of the data, communication bandwidth and the effect of latency.

In addition to normal charging operations, there are potential interruptions that would affect the reading of power consumption. For example, charging cable disconnected, fault generated by vehicle's battery management system (BMS), a Demand Respond (DR) message requesting the charger to be turned off, battery temperature etc. Records of these interruptions are event driven and the system architecture stores them in the database with a corresponding time stamp.

The control center architecture enables providing of a web based visualization portal as well as a mobile app-based capability to monitor power consumption of all chargers with graphical interface of charts and plots to analyze power consumptions.

1.1.3 Control Chargers

The system enables various charger control functions in WINSmartEV System. The control center architecture in WINSmartEV enables automatically controlled on/off of a charger based on various conditions from the sensor data, DR event, and user profile. A heuristic rule engine in the expert system of WINSmartEV enables rules that determine when to charge or backfill the battery on the vehicle automatically. Factors affecting such decisions include: transformer capacity, peak demand, time of use rate, critical peak pricing, users' preference on charging and backfill, battery profile, battery temperature, fault signal from BMS, Status of Charge (SOC) etc. The expert system architecture enables turning on/off the charger and sending the control signal to the charger. Detailed descriptions about using mobile devices to set user profiles and the demonstration of battery aggregation and backfill were previously discussed.

The control center enables manual control of the charger through graphical monitoring and controlling web interface.

1.1.4 Smart Charging Through Mobile Interfaces

Our inventive architecture allows the consumer the convenience of using Mobile devices to monitor and control EV battery charging and backfill operations. One of the salient features of WINSmartEV System is that it provides open architecture and web based interface for ease of integration with multiple protocols and platforms. The user would have the ability to access all the monitoring and control functions through multiple channels of communications. A common application enabled for this purpose is the web browser. In addition to using the web browser to monitor and control the charger, WINSmartEV also provides open API and interfaces for mobile application developers to create customized applications.

The architecture enables rapid design and implementation of the web interface and API interfaces mentioned above and also enables simple development of applications on iPhone OS and Android OS mobile devices. The functions provided on the mobile devices include:

(a) showing maps of available charging stations nearby (Location based service);

(b) monitoring state of charge (percentage, time to full charge, remaining miles);

(c) setting preference of charging (economic, fast, acceptable rates, etc.);

(d) receiving alerts on battery status (low battery alert);

(e) receiving message to opt in for battery backfill; and (f) setting preference of backfill (allowable discharge percentage, time of backfill, etc.)

EXAMPLE

An example of smart charging using mobile interface is as follows. The user comes to UCLA with an EV for a meeting at 9 am. User finds that the available charging station is located in parking lot #9 through his mobile device. User pulls in to parking lot #9 and connects the charger to user's EV. The user identifies with an RFID card to authorize the charging. The user then walks away and manages user's charging operations with user's mobile device. User specifies that by 3 pm, user wants user's EV to be charged to at least 60% so that vehicle has enough battery charge to go home—a first priority.

The user also specified that the maximum acceptable rate for the electricity is 20 cents per kW and he does not care about when his EV should be charged as long as the first priority is met. He was notified by an alert message sent to his mobile device at 1 pm that now, due to the peak power demands, his battery charging needs to be interrupted for about 15 min and his battery is now charged at 55% full. At 1:30 pm, another message was sent to him to ask him to opt in for battery backfill to support the peak power demand for 15 min, a compensation of $10 will be credited to his account and the battery will be discharged to 45%. He accepts the offer. At 1:45 pm, a message is sent to him saying that his battery charging has resumed and the expected time to 60% full is 2:30 pm. He leaves UCLA at 3 pm with 65% battery.

The architecture is extremely flexible and enables customization and generation of large numbers of such scenarios of using mobile device for smart charging. This architecture allows the study of user patterns and how the operations on mobile device will affect the power grid within UCLA.

1.2 Battery Aggregation And Back Fill

The architecture enables a unique control system algorithm to schedule electric vehicle charging and discharging in a manner that is beneficial for vehicle battery health, grid stability, and consumer demand.

There are three categories of capabilities that are part of the Battery Aggregation and Backfill category. These include Using Batteries into the Grid (1-Way Charging); Using Batteries into the Grid (2-Way Charging); and Demonstrate the Distribution Effects of Battery Aggregation and Backfill.

1.2.1 Use Of Batteries In The Grid (1 Way)

The architecture enables battery aggregation between all chargers installed in parking structures, these may include COTS chargers and WINSmartEV chargers and it can be level 1, level 2 and level 3 chargers. These levels have well documented capabilities in terms of current supply and format.

Charging aggregated electric vehicles in garages may result in an overload of the transformers at the distribution level. Each electric vehicle consumes about two to ten times the amount of power of a single kilowatt hour home during charging. Charge rates vary depending on levels of charging. Considering public adoption of level 2 charging that requires 220 Volts and greater than 50 Amps of current, the amount of power that a single electric vehicle can possible consume on peak is very high. The battery management system (BMS) for an electric vehicle is contained within each vehicle. Although charging current varies nonlinearly with time and percentage of charge, the BMS of the car handles charging. The challenge involved with EV integration is to balance that charging when a mass quantity of electric vehicles needs charging.

It is important when considering an aggregate scenario to take into account consumer behavior. Periods of time exist during the day where heavy traffic occupies a garage and the optimization of charging schedules will be necessary. Identifying each vehicle as well as monitoring their state of charge (SOC) will allow for greater flexibility of charging schedules. The Control Center architecture in WINSmartEV system enables taking into account various criteria to turn on or off a charger to ensure safety; grid capacity and consumer demands are met. The user behavior profile for a particular electric vehicle may also contain a number of miles that need to be driven after work, allowing those who travel longer distances to be prioritized over those who travel shorter distances.

Other considerations in this demonstration are the number of parking slots that are equipped with a charger. It is often unrealistic to have all parking slot equipped with chargers. One wants to avoid a situation where an EV charger slot is occupied with a non-electric vehicle. Due to limited parking spaces, too many dedicated EV parking slots should be avoided, so that a non-EV driver can find a slot to park. The system architecture described herein enables the study and experimentation with different parking regulations and approaches to maximize the chance for each EV to be charged when needed. These regulations and approaches include:

(a) having dedicated EV charger slots, but limiting the maximum hours of parking, which is particularly important for a level 3 charger, since the battery will be fully charged within an hour and the space should be made available to other EVs;

(b) putting some chargers on the top level of the parking structure where parking spaces are less likely to be occupied by non-EVs; and (c) adding additional Level 1 WINSmartEV chargers, since Level 1 WINSmartEV Chargers will be easier to deploy, monitor and control.

The Level 1 WINSmartEV Chargers will essentially be a box with wireless modules inside, and a standard 110 V outlet on the outside.

1.2.2 Use Of Batteries Into The Grid (2-Way)

The architecture enables installation and integration of appropriate grid-tie inverters and at certain chargers in parking structures to enable both the Vehicle-to-Grid (V2G) and Grid to Vehicle (G2V) operations. Depending on the make and model of the EV, battery backfill is often possible without modifying the BMS and other circuits on the EV. The WINSmartEV architecture enables the study and investigation of a non-destructive approach to implement this demonstration. The WINSmartEV system enables simple plug-and-play for additional circuits and modules.

Introducing backfill of electric vehicle charge, or Vehicle-to-Grid (V2G) discharge, has the potential to introduce instabilities and errors into the power grid. Considering that current electric vehicles do not have a battery management system for the reversal of charge flow, precautions need to be taken to monitor and control the rate of discharge from electric vehicles to ensure maximum battery lifetime. The WINSmartEV architecture takes into consideration power source/sink management optimization by taking into account variables such as: time of day, battery SOC, voltage, current, and temperature; and optimization algorithms that charge vehicles according to consumer scheduling, utility dynamic pricing, and battery health. The architecture implements a monitoring method to enable providing incentives for consumers who opt-in to the charge/discharge system. In this approach, the WINSmartEV control system takes into account such variables and enables simulation, test, and implementation of optimization control of electric vehicle charging/discharging.

The approach enables simulation to be performed in a controlled environment in order to implement control algorithms to ensure safety and quality control. Once simulation is complete, implementation of the optimization control will be performed on real physical electric vehicles with statistical accuracy of driver schedules and battery cycling.

1.3 Fully Functional Microgrid

The communications-based approach in WINSmartEV system enables the study of battery profile, performance and the influence to the power grid by:

(a) monitoring all chargers;
(b) reading the power consumption for vehicle that are connected to chargers;
(c) control chargers;
(d) smart charging through mobile interfaces;
(e) use of battery into the grid (1 way); and
(f) renewable and battery integration.

1.4 Renewables and Battery Integration

There are five integrated capabilities within the system architecture which include Community Storage on EV Batteries and External Storage; Garage of the Future; Cycling of the Batteries; Aggregation of the Batteries; and Integrated EV and Solar.

1.4.1 Community Storage on EV Batteries and External Storage

In this architecture, the energy storage battery modules (such as Lithium Ion) are stored within the parking structure or in proximally stored energy during off-peak hours, or based on the signals from the Control Center in WINSmartEV System. The battery would be stored in its own container and would require a BMS and inverter. Communication to the BMS from WINSmartEV in the architecture is through application programming interfaces (APIs).

The vehicles that are used for battery backfill demonstration are meant for energy storage in the architecture. The stored energy on the battery and on the EVs enables the charging of EVs or for powering the parking structure during peak consumption timings or by demand signal from the Control Center in WINSmartEV System.

1.4.2 Integrated EV and Solar

The architecture integrates solar panels in the parking structure as an energy source. The solar panels connect to an energy management system that communicates back to the control center to allow the control center to determine how to utilize the best energy collected by the solar panel—it can be directed to be stored within the external battery system installed or to power the lighting of the parking structure, or to backfill into the grid, or charge the EVs that are connected to the charging station.

Various loading scenarios can be integrated to monitor the efficiency and cost of energy usage and peak demand shift. This system enables the study of impact from V2G and renewable and battery integration as required.

1.5 Facility Integration

The architecture enables the integration of multiple facilities.

1.5.1 Test Bed

The WINSmartEV technology is controlled by the Control Center. The system enables servers to be equipped with firewall, uninterruptible power supply (UPS) and tamper resistant devices to enforce the security of the servers. The server also integrates with software and hardware tools and visualization portal for data analysis. It also enables documentation and reports that may be generated.

WINSmartEV technology also enables charging testing, and communications testing. This is performed by equipping the system with embedded system design kit development software, servers, design tool kits, automation tool kits, inverters, adaptors, wireless modules, testing charging stations, self-contained lithium ion batteries, battery management etc.

Field testing and commuter testing are enabled in the WINSmartEV architecture. COTS charging stations, WINSmartEV charging stations, and communication gateway installed in parking lots enable one and two way charging monitoring and controlling.

1.5.2 Test and Demo capability

The architecture is unique in its ability to create technology demonstrations to showcase capabilities important for the local grid and these include:

(a) monitoring of all chargers;
(b) reading of MW for All EVs;
(c) charger control and disconnect;
(d) smart charging through mobile interfaces;
(e) use of batteries to provide power for insertion into the grid (1-way and 2-way);
(f) aggregation of batteries;
(g) integration of EV solar power sources for grid power insertion;
(h) various EV charging algorithms and hardware;

(i) community power storage on EV batteries and external storage;
(j) local grid balancing and management;
(k) generation, transmission, and distribution effects of chargers and the garage of the future;
(l) grid impact under various loading scenarios;
(m) monitoring of power usage and car usage in a car share program;
(n) car sharing program effects on a distribution system.

1.6 Control Center

The WINSmartEV control center is a centralized system that controls and operates the various subsystems described.

2. System Architecture of WINSmartEV

The architecture, communication, and control application is part of the WINSmartEV research platform using the WINSmartGrid platform. WINSmartGrid is a sensing and controlling network architecture that has been developed for Smart Grid applications. WINSmartEV is a system that is focused on the integration of electric vehicles into the power grid application.

Referring again to FIG. 2A, at the communication layer, WINSmartEV utilizes various wireless communication protocols to collect data such as Vehicle ID, status of charge, battery temperature, power usage in kW, voltage and amperage and to send control signals to connect and disconnect a charger based on various inputs such as grid capacity, user preference, time of use, and demand respond events. It also provides a user interface to allow mobile devices to monitor and control electric vehicle's charging schema. An aggregator, or expert system 120, which is part of the architecture, determines the optimized charging and backfill operations based on various inputs such as EV profile, user preference, demand respond event, grid capacities.

The characteristics of the WINSmartEV system are: (a) low power technology; (b) standards-based protocols and hardware adapted to fit the problem resulting in lower overall cost; (c) a wireless infrastructure for monitoring and control; (d) a service architecture of three layers: edgeware, middleware, and centralware; (e) open architecture for easy integration; (f) a Plug-and-Play approach to the network installation; and (g) reconfigurability, allowing the capability of the technology to be reconfigurable would allow over the air (OTA) upgrades of the firmware and software to be able to handle different devices, applications, sensors, controllers, thermostats, etc.

Refer again to FIG. 2A, where in the WINSmartEV system a high level of communication architecture is shown. In the WINSmartEV architecture, the system allows for the testing with a variety of communication protocols so as to determine the optimized communication architecture to connect various components.

In the following subsections, the key components that are included in WINSmartEV are presented.

2.1 Communications Gateway In WINSmartEV

The communication between the edge components (EVs, mobile devices, charging stations, meters, etc) and the infrastructure is one of the central topics in EV charging/discharging operation. Compared to wired communication, wireless infrastructure has the advantage of lower cost, flexibility and mobility. In order to control the charging stations with low costs, low power wireless communication protocols and devices play an important role in this demonstration project.

ZigBee is well known for its characteristic of low power consumption and the capability of forming ad hoc as well as wireless mesh networks. Therefore, ZigBee is likely to be chosen to be the primary local mesh network in the WINSmartEV system design. Besides ZigBee, other popular wireless protocols, such as WiFi, Bluetooth, and 3G, are also able to be integrated into the architecture. The architecture enables studying of flexibility and feasibility and eventually in comparison to the ZigBee protocol. New versions of ZigBee including Smart Energy Profile (SEP) (both Versions 1.0 and 2.0) are able to be integrated into the WINSmartEV system based on the inherently flexible architecture design. In the future, it is expected the newer version of SEP would emerge and so the project would utilize the latest versions.

In this architecture, the control signals and commands are sent from the central server, which would be considered as the UCLA based control center. The commands comprise either connect or disconnect signals addressed to a specific charging station, or the lowering of demand for a local area. The local gateway with 3G, WiFi, and Bluetooth modules receives the relevant commands, and subsequently maps to the commands or compiles the commands into those that are dispatchable to the next level of the hierarchy, and then this module also dispatches the next level of commands to the addressable destination charging stations.

The charging stations with ZigBee, Bluetooth, or WiFi modules are connected to the local gateway through various available connection methods. ZigBee connection is the default choice, however, when ZigBee connection is not available due to the unsuitable environment for ZigBee or charging stations without ZigBee module, the gateway architecture enables connecting to the charging stations through WiFi or Bluetooth connections. The flexible architecture expands into emerging technologies such as Z-wave and home-plug within present explorations for demonstrations.

Today, Smart Grid technologies are advancing rapidly with new features technologies becoming available constantly. As new technologies are being created in this rapidly changing field, adding them to WINSmartEV architecture represents a substantial strength of the system and a necessary ingredient in various technology, research and demonstration projects. The use of general purpose yet low power processors such as the Atmel Arduino microprocessors and chips allows control signals sent to sensors and switches with the intent to turn on and off the addressable chargers. In turn, using battery storage systems enables backfill during peak demand situations, the ability of the system to send power back to the power grid, and subsequently recharge the battery storage systems during low peak intervals such as night or evening.

The ATMEGA328 uses the Arduino library to software to integrate the sensors and switches. The Arduino library provides an application interface to program these chips much faster, and more efficiently. Other sensors such as Hall effect sensors detect current running through batteries and appliances that can be monitored are integrated into the architecture.

2.2 Control Center

The control center architecture enables visualization and analysis of real time and historical data on EV usage, charging, and backfill operations. It also determines optimized charging and backfill operations based on: 1) demand response events; 2) user profiles; 3) solar panels; 4) battery storage systems; 5) power grid capacity limitations (transformer, cogeneration, etc.); and 6) battery characteristics. The architecture enables transmission of connect and disconnect signals to chargers, backfill inverters, solar panels, and battery management systems. It also provides interfaces for web based applications, demand response events, and other monitoring and control centers.

The control center architecture hosts various servers that store user data from all communication gateways and processes this data to determine the best actions to take and send out control signals. Cyber security plays a crucial role in the design of the control center. In the WINSmartEV architecture, firewall, UPS and other relevant authentication and authorization techniques are able to be integrated to protect the control center from cyber attacks and hacking.

2.3 EV Monitoring Unit

The architecture enables the integration of a sensor module on the EV's computer and circuits to obtain the following data: status of charge, temperature, odometer reading, CAN bus message (faults). Depending on the EV make and model, some of this information may not be readily available. A monitoring unit within the architecture enables Plug-and-Play ZigBee or other common wireless protocol communication modules, sensors, and, control circuits to communicate with the charging stations or the communication gateway.

2.4 Charging Stations

In the system architecture, charging stations from multiple vendors are able to be integrated and their usage monitored. These charging stations include level 1, level 2 and level 3 chargers. However, since most charging stations utilized proprietary communication protocols, the design of an open architecture charging station that supports the data collection and circuit control of this project is required. WINSmartEV enabled charging stations is used to provide the following functions: (a) an open architecture to collect user and vehicle profile, kW used, usage history, etc.; (b) battery aggregation, which is a dynamic charging scheme based on various inputs; (c) support both Level 1 and Lever 2 chargers; (d) include safety and security factors in the design; and (e) allow backfill integration controlled by WINSmartEV.

It should be noted that not all charging stations are required to have grid tie inverters to move stored electric vehicle (EV) battery power back onto the grid. In the communication status of an individual charging station, the status and presence of such a grid tie inverter would be communicated to the power grid expert system.

2.5 Mobile Devices

The system architecture is designed to allow integration and leveraging of mobile applications and devices, and EV aggregation approach is able to intelligently charge a large number of EVs according to user profile requirements while operating within the constraints of the power grid. In addition, this architecture is able to integrate and accommodate demand response events by selectively throttling or suspending EV charging.

The current prototypical implementation of the interface is an iPhone OS (iOS) application that acts as a client portal for EV owners to interact with their vehicle. The owner would use such an application in the following modalities: (a) monitoring of the EV status e.g. battery state of charge, time remaining until fully charged, total cost of charging; (b) selection of charge parameters e.g. fast charge, cheap charge, fully customizable selection of price, time, low charge alert, and completed charge alert; (c) viewing available charging stations and their current cost; (d) receiving alerts when battery state of charge is low or full; (e) receiving alerts to opt-in/out of delayed charging for demand response; and (f) vehicle-to-grid operation comprising real-time alerts to opt-in/out of vehicle-to-grid and definable parameters for automated vehicle-to-grid operation including minimum price ($/kWh) and maximum charge percentage willing to sacrifice.

In order for the application to receive real time data and alerts the application could be integrated into a server push architecture, wherein the server can send data in real-time through an existing connection to the device. A web based application mimicking the functionality of the iOS application would allow a consistent user experience among devices, including smart phones, tablets, and traditional computers such as laptops and desktops.

The mobile devices used in the WINSmartEV architecture of the system would enable real-time event based aggregation and charge scheduling. A central server would host this software, maintaining push connections to user devices, and maintaining a database of user charging preferences that would be synced whenever the user updates it using the web application. In addition, the server architecture would maintains a database of battery information including: (a) safety data including make, model, nominal capacity (Ah), nominal voltage (V), max charge current (A), charging voltage, and initial charging current; (b) current EV battery status (including a time stamp, location with latitude and longitude), status (charging, discharging, backfill), current state of charge (V); and (c) station ID, level, charging station location with latitude and longitude, level (1,2,3), plug type. The software within the WINSmartEV architecture would enable interfacing with hardware including the chargers themselves, if available, and sensor nodes via a direct interface or through a middleware.

Based on the available data, the WINSmartEV system architecture would enable optimized charge scheduling in order to level demand throughout the day and meet any demand response signal requirements. Scheduling is altered whenever an event occurs. Events include new price information, changes in user charge parameters, changes in power available, changes in current grid load, and when a new car connects with a charger. A manual override would be available for an operator to suspend individual or all charging. Vehicle-to-grid operations are another aspect of this system.

A graphical user interface for the aggregating charge scheduler is part of the system architecture. Such a GUI would allow a user to visualize in real time the vehicles being charging, their time of arrival, planned departure, the total load on each circuit and for the garage, and total power available for the specific day, all within an aggregated picture.

2.6 RFID Enabled Vehicle And User Identification

The architecture integrates RFID technology in vehicle and user identification as a component of WINSmartEV which in turn utilizes RFID technology. Although an RFID reader unit would be an integral part of a charging station, it has been shown separately as a reader, and the WINSmartEV architecture allows investigation of charging station and experimentation as separate units communicating with each other by the means of TCP/IP protocol.

The antenna placement of the RFID reader is customized and specially designed, as the RFID tag implanted on the electric vehicle approaching the charger unit would need to be read at distance of about 8-10 feet consistently while also avoiding false reads from other vehicles parked or moving around the charging station.

Some criteria regarding the RFID reader antenna are: 1) the reader antenna would have sufficiently directional radiation pattern to be able to read only one vehicle parked in front of it and avoid reads from other angles; and 2) the reader antenna would be placed on the ground looking skywards or skywards at an angle to read a tag placed on the vehicle license plate or bumper. Such placements result in minimal false reads as the reader would be able to see only the vehicle parked in front of it and would be blind to the vehicle's rear and its sides. Also, a predominantly metallic vehicle placed in front of an antenna would block out false reads from any other vehicles kept in front of the reader but behind the vehicle. The WINSmartEV architecture and approach enables experimentation and verification on a larger scale of a parking lot.

The tag read by the reader would serve as an automated authentication for the EV and its user. Ideally, the process of reading a tag on the vehicle would be similar to swiping a credit card at contemporary gas stations. The tag ID read by the reader would be used to fetch information about the EV and the associated user's account. The back end system would process the tag ID to enable charging of the EV.

The back end system will primarily consist of two stages. First stage is a control center which uses the tag ID to fetch account balance and associated information of the user. After fetching the information, the control center would determine if the user is eligible for charging and has sufficient credit in his account. At a second stage, the control center would also remove energy from the car batteries to provide backfill to the grid, which will likely involve some complex demand supply algorithms. Discharging car batteries to supplement the energy requirements for the grid would also involve crediting the account balance of the user to induce the user to undertake such a discharge.

The data model for the RFID transaction would be open architecture based and the RFID technology selection would either be from existing standards or if not, would also be open. The openness of such a WINSmartEV would enable a scalable solution.

The connection between the first stage and the second stage of the architecture is web based, so there needs to be either a wireless or wired internet access at the charging station. At the second stage, the control center and the database could be housed at the same location or could be disposed at some distance. The WINSmartEV architecture would allow database servers to be used to maintain the relevant user account information for EV charging and would also enable third party database service providers to provide the service.

Outsourcing the database service to external service providers would allow economical solutions in certain situations for the charging station function, as it may reduce overall costs in terms of database maintenance, administration, etc. The WINSmartEV architecture would enable the ability to pay the service providers only for the amount of data transactions performed provides an opportunity to both small and large charging station organizations to minimize costs in data storage and the option to scale up their operations easily. Cloud based database service providers are typical in such a distributed architecture for the above mentioned reasons.

The table within the architecture that stores user credit and charge would likely have five different fields. The first field would be the user identification (ID), which would be the primary key in the database. This would be used to retrieve all transactions performed by the user. The second field would be the EV ID. This would be used to link the EV to its registered user. The third field would be the residential balance of the user. The fourth field would be the EV balance. This field would store the amount of balance owed by/to the user based on his EV charging. The final field would be the account balance. This will be the total combined energy consumption balance of the user.

Embodiments of the present invention may be described herein with reference to flowchart illustrations of methods and systems according to embodiments of the invention. These methods and systems can also be implemented as computer program products. In this regard, each block or step of a flowchart, and combinations of blocks (and/or steps) in a flowchart, can be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the block(s) of the flowchart(s).

Accordingly, blocks of the flowcharts support combinations of means for performing the specified functions, combinations of steps for performing the specified functions, and computer program instructions, such as embodied in computer-readable program code logic means, for performing the specified functions. It will also be understood that each block of the flowchart illustrations, and combinations of blocks in the flowchart illustrations, can be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer-readable memory that can direct a computer or other programmable processing apparatus to function in a particular manner, such that the instructions stored in the computer-readable memory produce an article of manufacture including instruction means which implement the function specified in the block(s) of the flowchart(s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the block(s) of the flowchart(s).

From the discussion above it will be appreciated that the invention can be embodied in various ways, including the following:

1. A power grid expert system (PGES), comprising: a charging station configured for charging a battery in an electric vehicle from an electric power grid; the charging station optionally comprising a grid tie inverter configured for backfilling power from an electric vehicle connected to the charging station into the electric power grid; a PGES computer; and programming that is executable on the PGES computer for performing steps comprising: selectively controlling a charging of the battery in the electric vehicle by the charging station; or if the charging station has the grid tie inverter, then: selectively controlling a discharging of the battery for backfilling power to the electric power grid from the battery in the electric vehicle.

2. The PGES of embodiment 1, wherein the charging station is configured for wirelessly communicating information to the electric vehicle, the information selected from the group consisting of: a location of the charging station; a charge capacity of the charging station; whether or not the grid tie inverter is present; and a recent cost per kWh of charge at the charging station.

3. The PGES of embodiment 1, further comprising: a control center; and communications equipment configured for communications among the control center, the charging station, and the electric vehicle.

4. The PGES of embodiment 3, wherein a transceiver resident on the electric vehicle acquires one or more pieces of information from the electric vehicle selected from a group of data consisting of: a geographical position of the electric vehicle; a state of charge of the battery in the electric vehicle;

a speed of the electric vehicle; a current draw from the battery in the electric vehicle; a state of health of the battery in the electric vehicle; and an identification of the electric vehicle.

5. A battery management system (BMS) for managing a battery in an electric vehicle, the apparatus comprising: a BMS computer; a voltage sensor, connected to the BMS computer, for measuring battery voltage; a current sensor, connected to the BMS computer, for measuring battery current; and programming that is executable on the BMS computer for performing steps comprising: mapping a reference open circuit voltage (ROCV) to a reference state of charge (RSOC) of the battery through a discharge cycle to produce an ROCV-RSOC mapping; measuring a current and a voltage over a period of time from the battery; calculating an open circuit voltage (OCV) of the battery under a load; and using the ROCV-RSOC mapping for determining an instantaneous state of charge (SOC) for the corresponding calculated open circuit voltage (OCV).

6. The BMS of embodiment 5, further comprising: a transceiver configured to wirelessly communicate between the electric vehicle and a power grid expert system (PGES).

7. The BMS of embodiment 6, further comprising: a client portal display device, comprising a processor; an application that is executable on the processor for performing steps comprising: calculating a time averaged rate of battery discharge from the measuring of the current over the period of time from the battery; determining a projected range of the electric vehicle by using the SOC and a maximum capacity of the battery, and the time averaged rate of battery discharge; acquiring a cost per kWh of charge at a charging station; and displaying on the client portal display device one or more data selected from the group consisting of: the SOC of the electric vehicle; the projected range of the electric vehicle; the cost per kWh of charge at a location of the charging station; and the location of the charging station.

8. The BMS of embodiment 5, wherein said programming performs steps comprising: determining a maximum capacity of the battery through calculations performed on the measured current and voltage over a period of time from the battery; and tracking over time the maximum capacity of the battery as a state of health of the battery.

9. The BMS of embodiment 5, wherein the batter state of charge (SOC) is determined without using a schematic model of the battery.

10. The BMS of embodiment 5, wherein said programming performs steps comprising: determining a time-averaged current draw by averaging the measured current over the period of time from the battery; determining a time-averaged electric vehicle speed by averaging a speed of the electric vehicle over another period of time; determining a remaining battery capacity by multiplying the state of charge (SOC) by a maximum capacity of the battery; and determining a remaining range by dividing the remaining battery capacity by the time-averaged current draw, and multiplying by a time-averaged electric vehicle speed.

11. The BMS of embodiment 10, wherein said programming performs steps comprising: transmitting from the electric vehicle the remaining range to a client portal; and optionally displaying on the client portal the remaining range.

12. The BMS of embodiment 11, wherein the transmitting step is either direct, or via a relayed transmission through a power grid expert system.

13. The apparatus of embodiment 11, wherein said client portal comprises: a display device; and a transceiver configured to wirelessly communicate with the electric vehicle and the power grid expert system (PGES).

14. The BMS of embodiment 6 or 13, wherein the power grid expert system (PGES) comprises: a charging station configured for charging a battery in an electric vehicle from an electric power grid; said charging station optionally including a grid tie inverter configured for backfilling power from an electric vehicle connected to the charging station into the electric power grid; a PGES computer; and a program that is executable on the PGES computer for performing steps comprising: selectively controlling a charging of the battery in the electric vehicle by the charging station; or if the charging station has the grid tie inverter, then: selectively controlling a discharging of the battery for backfilling power to the electric power grid from the battery in the electric vehicle.

15. An electric vehicle apparatus, comprising: an electric vehicle; a battery in the electric vehicle; a computerized control system in the electric vehicle; a voltage sensor, connected to the computerized control system, for measuring battery voltage; a current sensor, connected to the computerized control system, for measuring battery current; computerized control system programming executable on the computerized control system for performing steps comprising: mapping a reference open circuit voltage (ROCV) to a reference state of charge (RSOC) of the battery through a discharge cycle to produce a ROCV-RSOC mapping; measuring a current and a voltage over a period of time from the battery; calculating an open circuit voltage (OCV) of the battery under a load; and using the ROCV-RSOC mapping for determining an instantaneous state of charge (SOC) for the corresponding calculated open circuit voltage (OCV); and a transceiver configured for wireless communication between the computerized control system and a power grid expert system (PGES).

16. The apparatus of embodiment 15, wherein said power grid expert system (PGES) comprises: a charging station configured for charging the battery in the electric vehicle from an electric power grid; said charging station optionally including a grid tie inverter configured for backfilling power from an electric vehicle connected to the charging station into the electric power grid; a computer; and programming executable on the computer for selectively controlling charging the battery in an electric vehicle connected to the charging station and, if the grid tie inverter is present, then backfilling power to the power grid from the battery in an electric vehicle connected to the charging station.

17. The apparatus of embodiment 15, further comprising: a client portal display device comprising a processor; a programming executable on the processor for performing steps comprising: determining a projected range of the electric vehicle; acquiring a cost per kWh of charge at a charging station; and displaying on the client portal display device one or more data consisting of: state of charge of the electric vehicle, projected range of the electric vehicle, and cost per kWh of charge at a charging station.

18. The apparatus of embodiment 15, wherein said computerized control system programming executable performs steps comprising: determining a time-averaged current draw by averaging the current over the period of time from the battery; determining a time-averaged electric vehicle speed by averaging the electric vehicle speed over another period of time; determining a remaining battery capacity by multiplying the state of charge (SOC) by a maximum capacity of the battery; and determining a remaining range by dividing the remaining battery capacity by the time-averaged current draw, and multiplying by the time-averaged electric vehicle speed.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An apparatus for determining instantaneous state of charge (SOC) for managing a battery in an electric vehicle, the apparatus comprising:
   (a) a battery management circuit having a computer processor and memory configured for controlling battery charging in an electric vehicle;
   (b) a voltage sensor connected to said battery management circuit and configured for measuring battery voltage;
   (c) a current sensor connected to said battery management circuit configured for measuring battery current; and
   (d) programming executable from said computer processor of said battery management circuit for performing steps comprising:
      (i) mapping a reference open circuit voltage (ROCV) to a reference state of charge (RSOC) of the battery through a discharge cycle to produce an ROCV-RSOC mapping;
      (ii) measuring a current and a voltage over a period of time from the battery;
      (iii) determining an open circuit voltage (OCV) of the battery under a load in response to:
         (iii)(A) performing a time window based OCV extraction process in which over a plurality of short time windows OCV is extracted at multiple sample points in each of said short time windows;
         (iii)(B) estimating battery terminal voltage at time t from a combination of zero-input response corresponding to a terminal voltage with no discharge current, plus a zero state response corresponding to battery terminal voltage with a discharge current i as input and voltage source shorted as determined from convolving an impulse response of the linear system with discharge current i;
         (iii)(C) wherein zero-input response in a first of said short time windows as being actual open circuit battery terminal voltage;
         (iii)(D) wherein in each short time window, after said first of said short time windows, impulse response is determined and a voltage removed which corresponds to voltage caused by current flow in previous windows;
      (iv) determining an instantaneous state of charge (SOC) for the corresponding estimated open circuit voltage (OCV) in response to using said ROCV-RSOC mapping, without relying on a synthesizing circuit model of the battery which mimics specific battery behavior; and
      (v) outputting SOC on a display device.

2. The apparatus recited in claim 1, further comprising:
a transceiver configured to wirelessly communicate between the electric vehicle (EV) and a power grid expert system (PGES) configured for performing grid balancing, grid management and prediction of peak and off-peak hours to store excess capacity, and demands for EV charging.

3. The apparatus recited in claim 2, further comprising:
a portal display device in said electric vehicle (EV);
a computer processor in said EV, and coupled to said portal display device for receiving inputs and displaying outputs on said portal display device;
programming executable on said computer processor for performing steps comprising:
   determining a time averaged rate of battery discharge from the measuring of the current over the period of time from said battery;
   determining a projected range of the EV by using the determined state of charge (SOC) in relation to maximum capacity of the battery and time averaged rate of battery discharge;
   acquiring a cost per kWh of charge at a charging station; and
   displaying on the client portal display device one or more data selected from the group consisting of:
      the SOC of the electric vehicle;
      the projected range of the electric vehicle;
      the cost per kWh of charge at a location of the charging station; and
      the location of the charging station.

4. The apparatus recited in claim 1, wherein said programming in the battery management circuit performs steps comprising:
determining a maximum capacity of the battery in response to a relation between measured current and voltage over a period of time from the battery; and
tracking over time maximum capacity of the battery as a state of health of the battery.

5. The apparatus recited in claim 1, wherein said programming is further configured to performs steps comprising:
determining a time-averaged current draw by averaging the measured current over the period of time from the battery;
determining a time-averaged electric vehicle speed by averaging a speed of the electric vehicle over another period of time;
determining a remaining battery capacity by multiplying the state of charge (SOC) by a maximum capacity of the battery; and
determining a remaining range by dividing the remaining battery capacity by the time-averaged current draw, and multiplying by a time-averaged electric vehicle speed.

6. The apparatus recited in claim 5, wherein said programming is further configured for performs steps comprising transmitting from the electric vehicle (EV) the remaining range to a client portal.

7. The apparatus recited in claim 6, wherein said programming is further configured for performs steps comprising controlling the display of remaining range on said client portal.

8. The apparatus recited in claim 6, wherein said transmitting is performed either directly, or is a relayed transmission through a power grid expert system (PGES).

9. The apparatus recited in claim 6, wherein said client portal comprises:
a display device; and
a transceiver configured to wirelessly communicate with the electric vehicle and the power grid expert system (PGES).

10. The apparatus recited in claim 2, wherein interoperation between said electric vehicle (EV) and said power grid expert system (PGES) aggregates state of the charge information from vehicles with demand dispatch and demand response signals to automatically achieve grid-to-vehicle charging or reverse charging from vehicle-to-grid.

11. The apparatus recited in claim 2, wherein the power grid expert system (PGES) comprises:
a charging station configured for charging a battery in an electric vehicle from an electric power grid;
said charging station optionally including a grid tie inverter configured for backfilling power from an electric vehicle connected to the charging station into the electric power grid;
a PGES computer processor; and
programming executable on the PGES computer processor for performing steps comprising:
selectively controlling a charging of the battery in the electric vehicle (EV) by the charging station; and
selectively controlling discharging of the battery for backfilling power to the electric power grid from the battery in the electric vehicle if the charging station has the grid tie inverter.

12. The apparatus recited in claim 1, wherein said state of charge (SOC) comprises a percentage value, indicating an amount of energy available in the battery of an electric vehicle (EV), said SOC utilized for controlling battery charging, dynamic power management, and power backfilling on a power grid.

13. An apparatus for determining instantaneous state of charge (SOC) for managing a battery in an electric vehicle, the apparatus comprising:
(a) a battery management circuit having a computer processor and memory configured for controlling battery charging in an electric vehicle;
(b) a voltage sensor connected to said battery management circuit and configured for measuring battery voltage;
(c) a current sensor connected to said battery management circuit configured for measuring battery current; and
(d) programming executable from said computer processor of said battery management circuit determining state of charge (SOC), as a percentage value of energy available in the battery of the electric vehicle (EV), by performing steps comprising:
(i) mapping a reference open circuit voltage (ROCV) to a reference state of charge (RSOC) of the battery through a discharge cycle to produce an ROCV-RSOC mapping;
wherein said mapping of ROCV-RSOC includes determining a maximum capacity of the battery in response to a relation between measured current and voltage over a period of time from the battery, and tracking maximum capacity of the battery over time as a state of health of the battery;
(ii) measuring a current and a voltage over a period of time from the battery;
(iii) determining an open circuit voltage (OCV) of the battery under a load in response to:
(iii)(A) performing a time window based OCV extraction process in which over a plurality of short time windows OCV is extracted at multiple sample points in each of said short time windows;
(iii)(B) determining battery terminal voltage at time t from a combination of zero-input response corresponding to a terminal voltage with no discharge current, plus a zero state response corresponding to battery terminal voltage with a discharge current i as input and voltage source shorted as determined from convolving an impulse response of the linear system with discharge current i;
(iii)(C) wherein zero-input response in a first of said short time windows as being actual open circuit battery terminal voltage;
(iii)(D) wherein in each short time window, after said first of said short time windows, impulse response is determined and a voltage removed which corresponds to voltage caused by current flow in previous windows;
(iv) determining an instantaneous state of charge (SOC) for the corresponding determined open circuit voltage (OCV) in response to using said ROCV-RSOC mapping, without relying on a synthesizing circuit model of the battery which mimics specific battery behavior; and
(v) outputting SOC on a display device.

14. The apparatus recited in claim 13, further comprising:
a transceiver configured to wirelessly communicate between the electric vehicle (EV) and a power grid expert system (PGES) configured for performing grid balancing, grid management and prediction of peak and off-peak hours to store excess capacity, and demands for EV charging.

15. The apparatus recited in claim 13, further comprising:
a portal display device in said electric vehicle (EV);
a computer processor in said EV, and coupled to said portal display device for receiving inputs and displaying outputs on said portal display device;
programming executable on said computer processor for performing steps comprising:
determining a time averaged rate of battery discharge from the measuring of the current over the period of time from said battery;
determining a projected range of the EV by using the determined state of charge (SOC) in relation to maximum capacity of the battery and time averaged rate of battery discharge;
acquiring a cost per kWh of charge at a charging station; and
displaying on the client portal display device one or more data selected from the group consisting of:
the SOC of the electric vehicle;
the projected range of the electric vehicle;
the cost per kWh of charge at a location of the charging station; and
the location of the charging station.

16. The apparatus recited in claim 15, wherein said programming is further configured to perform steps comprising:
determining a time-averaged current draw by averaging the measured current over the period of time from the battery;
determining a time-averaged electric vehicle speed by averaging a speed of the electric vehicle over another period of time;
determining a remaining battery capacity by multiplying the state of charge (SOC) by a maximum capacity of the battery; and determining a remaining range by dividing the remaining battery capacity by the time-averaged current draw, and multiplying by a time-averaged electric vehicle speed.

17. The apparatus recited in claim 16, wherein said programming is further configured for performs steps comprising transmitting from the electric vehicle (EV) the remaining range to a client portal.

18. The apparatus recited in claim 17, wherein said programming is further configured for performs steps comprising controlling the display of remaining range on said client portal.

19. The apparatus recited in claim 17, wherein said transmitting is performed either directly, or is a relayed transmission through a power grid expert system (PGES).

20. The apparatus recited in claim 17, wherein said client portal comprises:
   a display device; and
   a transceiver configured to wirelessly communicate with the electric vehicle and the power grid expert system (PGES).

* * * * *